(12) United States Patent
Lee et al.

(10) Patent No.: US 12,068,386 B2
(45) Date of Patent: *Aug. 20, 2024

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/316,419

(22) Filed: May 12, 2023

(65) Prior Publication Data

US 2023/0282725 A1 Sep. 7, 2023

Related U.S. Application Data

(63) Continuation of application No. 17/189,779, filed on Mar. 2, 2021, now Pat. No. 11,688,786.

(Continued)

(51) Int. Cl.
*H01L 29/49* (2006.01)
*H01L 21/02* (2006.01)
(Continued)

(52) U.S. Cl.
CPC .... *H01L 29/4908* (2013.01); *H01L 21/02603* (2013.01); *H01L 21/28088* (2013.01);
(Continued)

(58) Field of Classification Search
CPC ........... H01L 29/4908; H01L 21/02603; H01L 21/28088; H01L 21/28518;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

DE 102016116310 A1 4/2017
DE 102019121722 A1 4/2020
(Continued)

*Primary Examiner* — Tong-Ho Kim
(74) *Attorney, Agent, or Firm* — Slater Matsil, LLP

(57) ABSTRACT

In an embodiment, a device includes: a first channel region; a second channel region; and a gate structure around the first channel region and the second channel region, the gate structure including: a gate dielectric layer; a first p-type work function metal on the gate dielectric layer, the first p-type work function metal including fluorine and aluminum; a second p-type work function metal on the first p-type work function metal, the second p-type work function metal having a lower concentration of fluorine and a lower concentration of aluminum than the first p-type work function metal; and a fill layer on the second p-type work function metal.

20 Claims, 31 Drawing Sheets

Related U.S. Application Data

(60) Provisional application No. 63/140,288, filed on Jan. 22, 2021.

(51) Int. Cl.
| | |
|---|---|
| *H01L 21/28* | (2006.01) |
| *H01L 21/285* | (2006.01) |
| *H01L 21/8238* | (2006.01) |
| *H01L 27/092* | (2006.01) |
| *H01L 29/06* | (2006.01) |
| *H01L 29/423* | (2006.01) |
| *H01L 29/45* | (2006.01) |
| *H01L 29/66* | (2006.01) |
| *H01L 29/786* | (2006.01) |

(52) U.S. Cl.
CPC ............ *H01L 21/28518* (2013.01); *H01L 21/823807* (2013.01); *H01L 21/823814* (2013.01); *H01L 21/823842* (2013.01); *H01L 21/823864* (2013.01); *H01L 21/823871* (2013.01); *H01L 27/092* (2013.01); *H01L 29/0673* (2013.01); *H01L 29/42392* (2013.01); *H01L 29/45* (2013.01); *H01L 29/66545* (2013.01); *H01L 29/66553* (2013.01); *H01L 29/66742* (2013.01); *H01L 29/78696* (2013.01)

(58) Field of Classification Search
CPC ..... H01L 21/823807; H01L 21/823814; H01L 21/823842; H01L 21/823864; H01L 21/823871; H01L 27/092; H01L 29/0673; H01L 29/42392; H01L 29/45; H01L 29/66545; H01L 29/66553; H01L 29/66742; H01L 29/78696; H01L 29/401; H01L 29/66439; H01L 21/76897; H01L 29/165; H01L 29/7848; H01L 29/775; H01L 27/0924; H01L 21/823821; H01L 21/823828; H01L 29/4966; H01L 21/823857; H01L 29/517; B82Y 10/00
USPC ........................................................ 257/347
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,991,357 | B2 | 6/2018 | Song et al. |
| 10,410,933 | B2 | 9/2019 | Xie et al. |
| 10,461,167 | B2 | 10/2019 | Lee et al. |
| 11,088,034 | B2 | 8/2021 | Cheng et al. |
| 11,688,786 | B2 * | 6/2023 | Lee .......... H01L 21/28518 |
| | | | 257/347 |
| 2017/0301544 | A1 | 10/2017 | Chi et al. |
| 2019/0165113 | A1 | 5/2019 | Lin et al. |
| 2020/0066535 | A1 | 2/2020 | Lin et al. |
| 2020/0135868 | A1 | 4/2020 | Han et al. |
| 2020/0135915 | A1 | 4/2020 | Savant et al. |
| 2021/0074593 | A1 | 3/2021 | Savant et al. |

FOREIGN PATENT DOCUMENTS

| | | |
|---|---|---|
| DE | 102019128758 A1 | 4/2020 |
| DE | 102019125773 A1 | 3/2021 |
| KR | 20170005282 A | 1/2017 |
| KR | 20190000965 A | 1/2019 |
| KR | 20200135724 A | 12/2020 |
| TW | 201901761 A | 1/2019 |

* cited by examiner

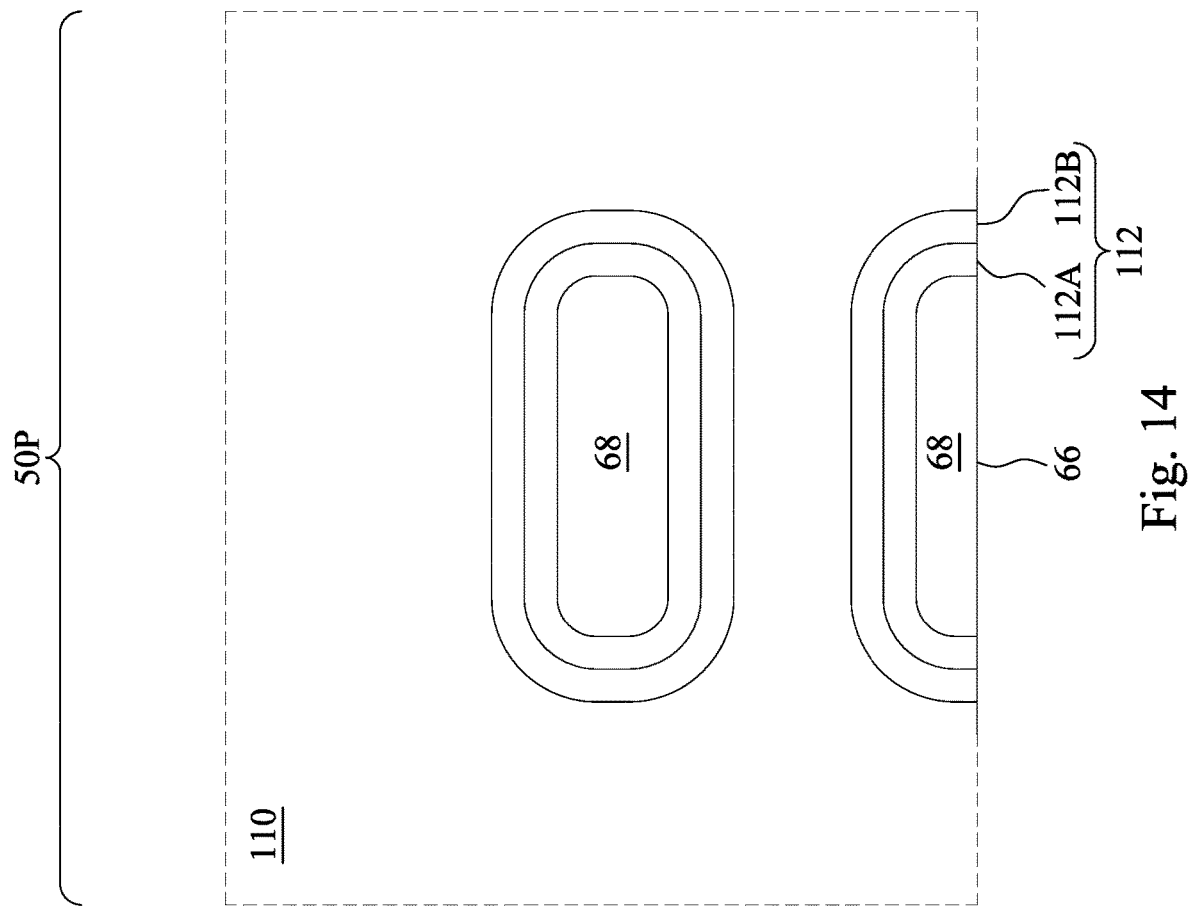

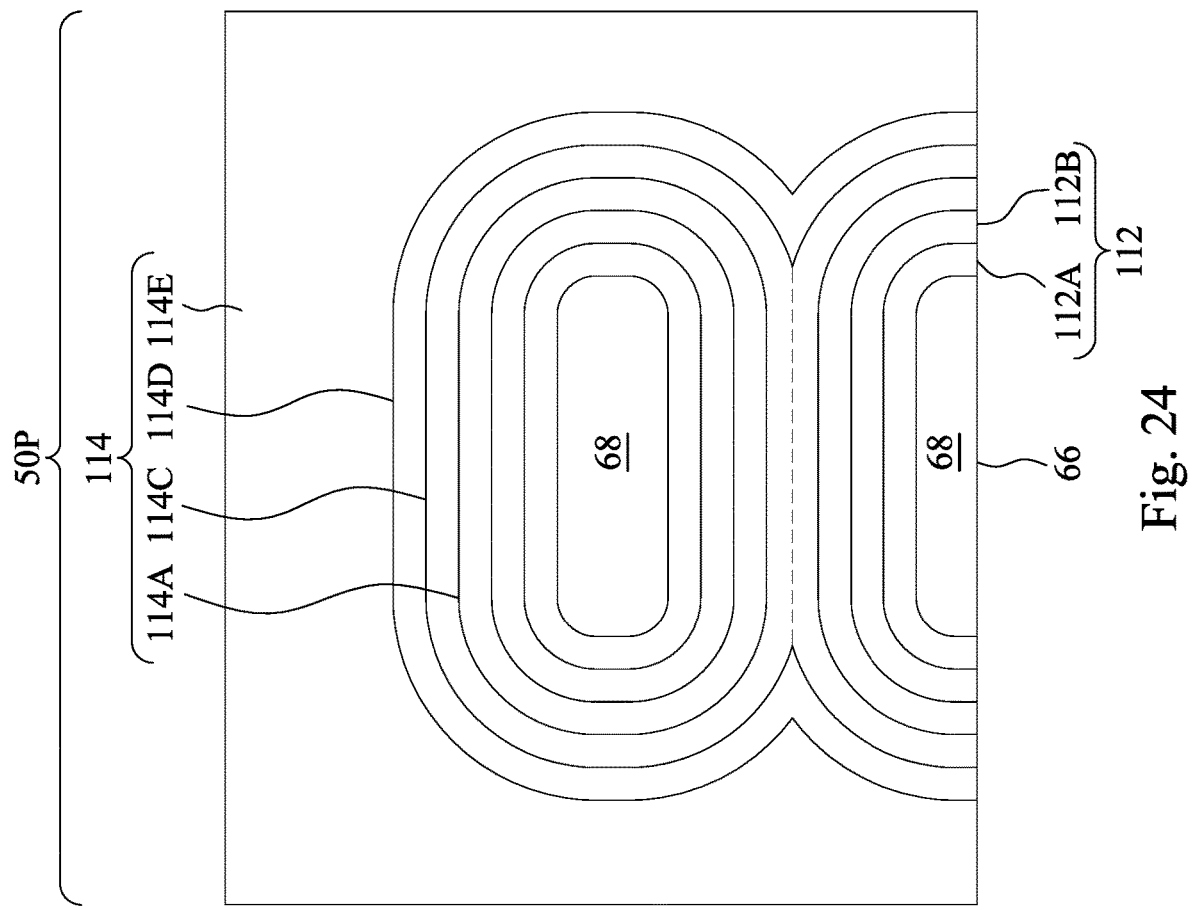

SEMICONDUCTOR DEVICES AND METHODS OF FORMING THE SAME

PRIORITY CLAIM AND CROSS-REFERENCE

This application is a continuation of U.S. patent application Ser. No. 17/189,779, filed on Mar. 2, 2021, entitled "Semiconductor Device and Method," which claims the benefit of U.S. Provisional Application No. 63/140,288, filed on Jan. 22, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 22B are views of intermediate stages in the manufacturing of nano-FETs, in accordance with some embodiments.

FIG. 24 is a view of nano-FETs, in accordance with some other embodiments.

FIGS. 25A through 26 are views of FinFETs, in accordance with some embodiments.

DETAILED DESCRIPTION

Figure 1:
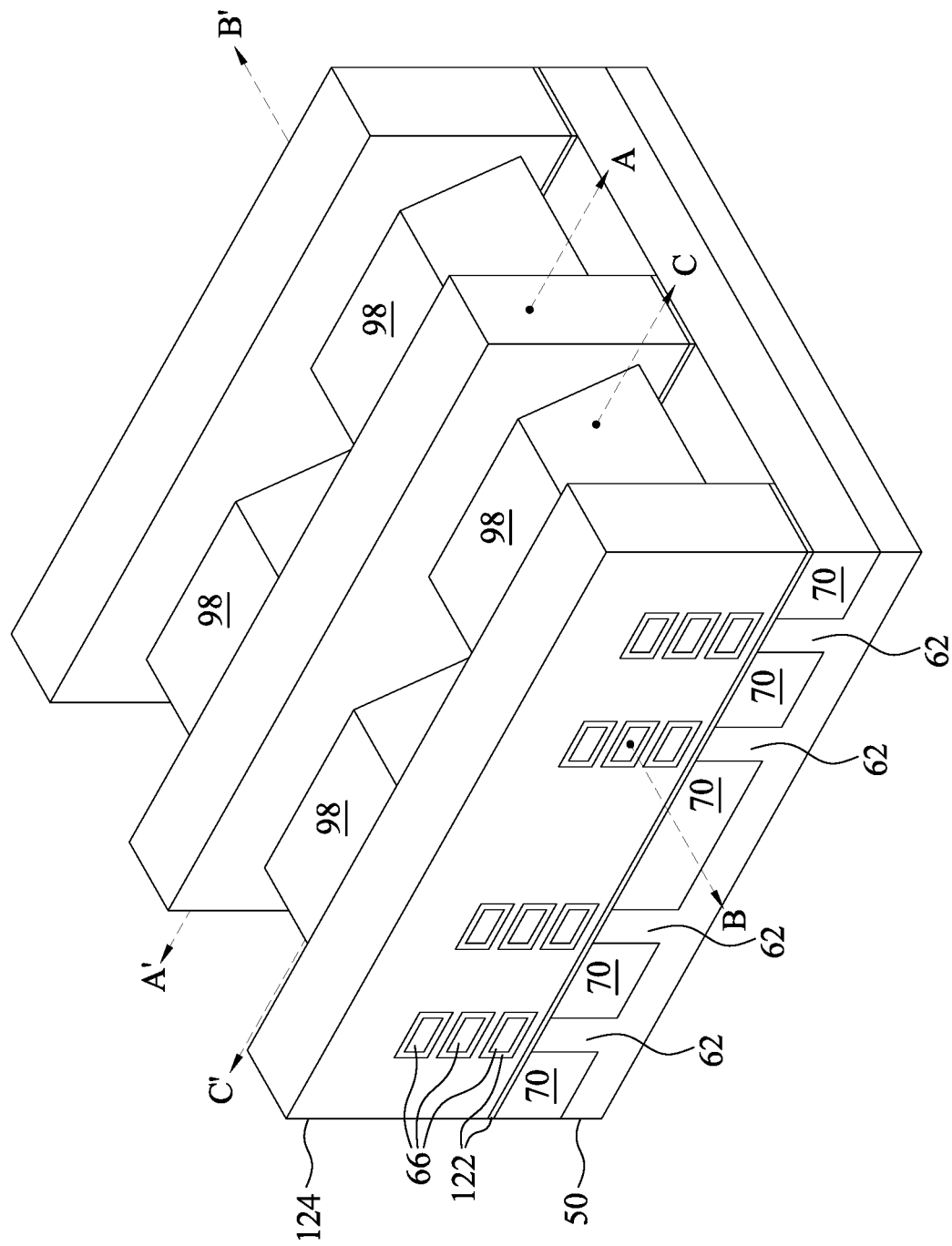
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, gate structures for transistors are formed having a fluorine-treated work function metal (WFM) layer. For example, the fluorine treatment may include performing a fluorine soak on a WFM layer, which may also diffuse fluorine into an underlying gate dielectric (e.g., a high-k gate dielectric). An aluminum treatment is performed on the WFM layer before the fluorine treatment to increase the effectiveness of the fluorine treatment. As a result, a flatband voltage ($V_{FB}$) of the resulting transistor can be increased towards a band edge of the metal of the WFM layer, a threshold voltage of the resulting transistor can be decreased, and device performance may be improved.

Embodiments are described in a particular context, a die including nano-FETs. Various embodiments may be applied, however, to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 at opposing sides of the gate dielectrics 122 and the gate electrodes 124. The epitaxial source/drain regions 98 may be shared between various fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' is along a longitudinal axis of a nanostructure 66 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 22B are views of intermediate stages in the manufacturing of nano-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14, 15, 16, 17, 18, 19, 20A, 21A, and 22A illustrate reference cross-section A-A' illustrated in FIG. 1, except two fins are shown. FIGS. 7B, 8B, 9B, 10B, 11B, 12B, 13B, 20B, 21B, and 22B illustrate reference cross-section B-B' illustrated in FIG. 1. FIGS. 9C and 9D illustrate reference cross-section C-C' illustrated in FIG. 1, except two fins are shown.

Figure 2:
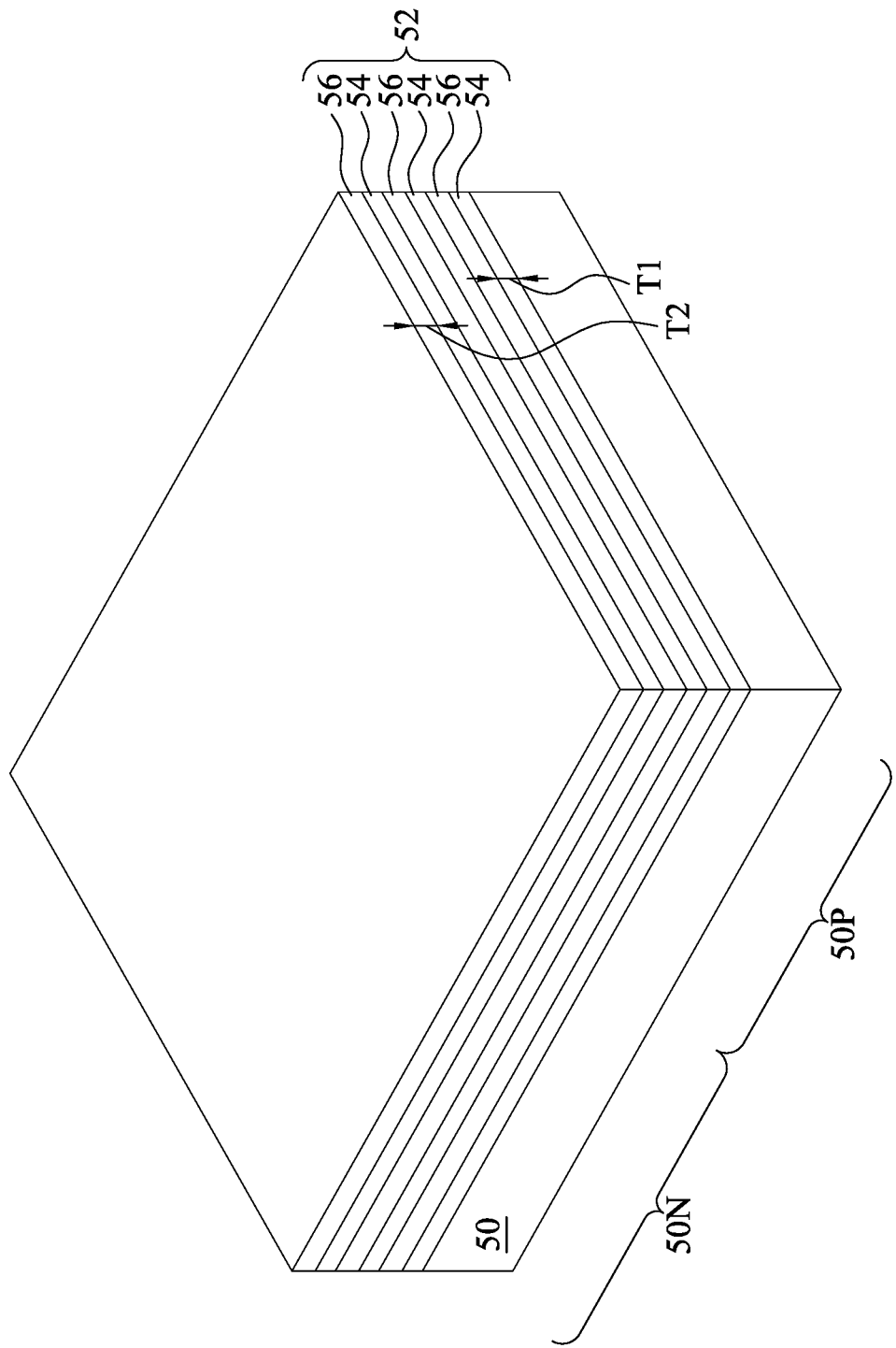

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has a n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or a n-type impurity. An anti-punch-through (APT) implantation may be performed on an upper portion of the substrate 50 to form an APT region. During the APT implantation, dopants may be implanted in the substrate 50. The dopants may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for channel regions for both n-type and p-type nano-FETs, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be suitable for p-type nano-FETs, such as silicon germanium (e.g., $Si_xGe_{1-x}$, where x can be in the range of 0 to 1), pure or substantially pure germanium, a III-V compound semiconductor, a II-VI compound semiconductor, or the like. The second semiconductor material of the second semiconductor layers 56 may be suitable for n-type nano-FETs, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of about 5 nm to about 30 nm. In some embodiments, some layers (e.g., the second semiconductor layers 56) are formed to be thinner than other layers (e.g., the first semiconductor layers 54). For example, in embodiments where the first semiconductor layers 54 are sacrificial layers (or dummy layers) and the second semiconductor layers 56 are patterned to form channel regions for the nano-FETs, the first semiconductor layers 54 can have a first thickness $T_1$ and the second semiconductor layers 56 can have a second thickness $T_2$, with the second thickness $T_2$ being from about 30% to about 60% less than the first thickness $T_1$. Forming the second semiconductor layers 56 to a smaller thickness allows the channel regions to be formed at a greater density.

Figure 3:
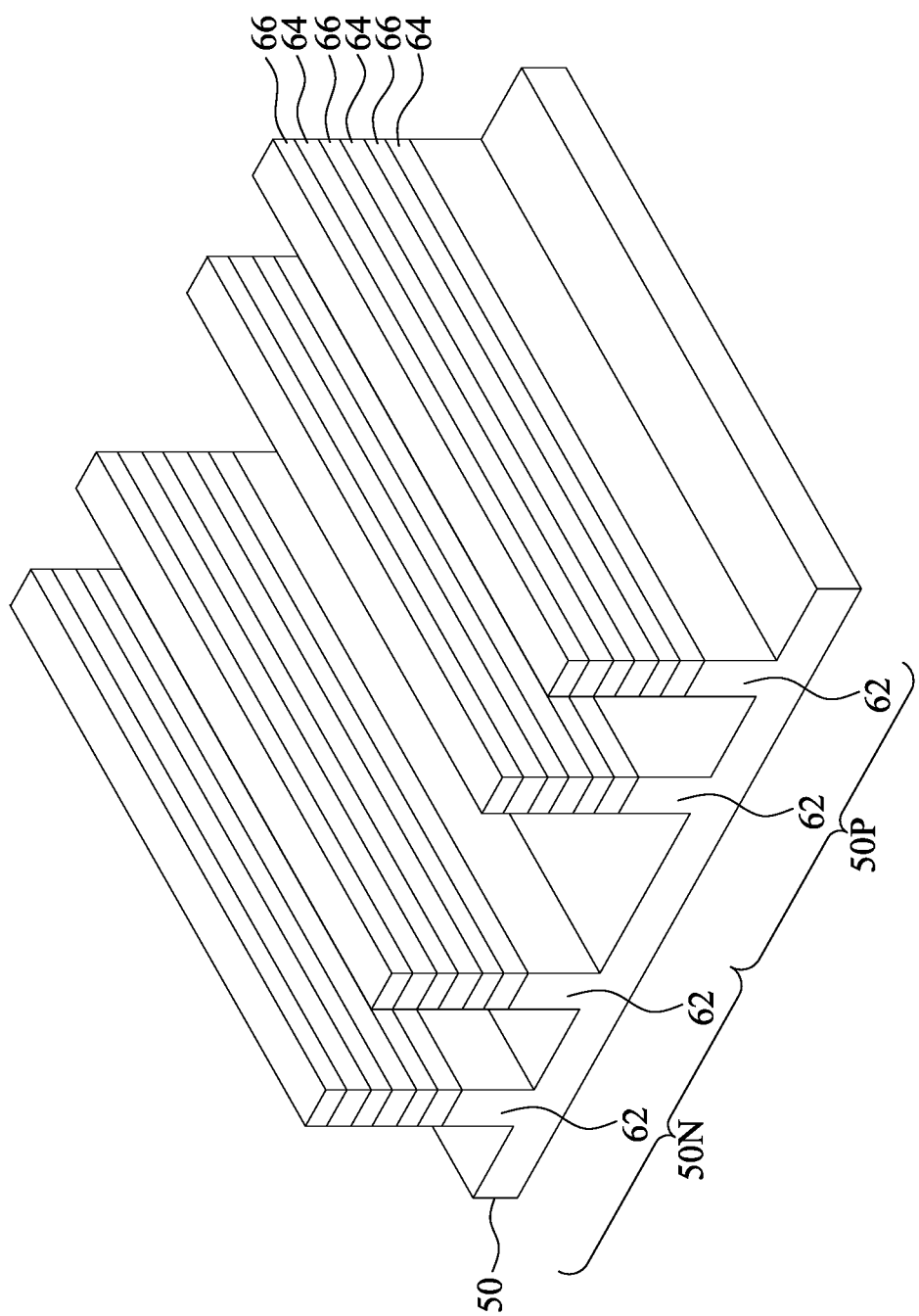

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range of about 8 nm to about 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in the other region (e.g., the p-type region 50P).

Figure 4:
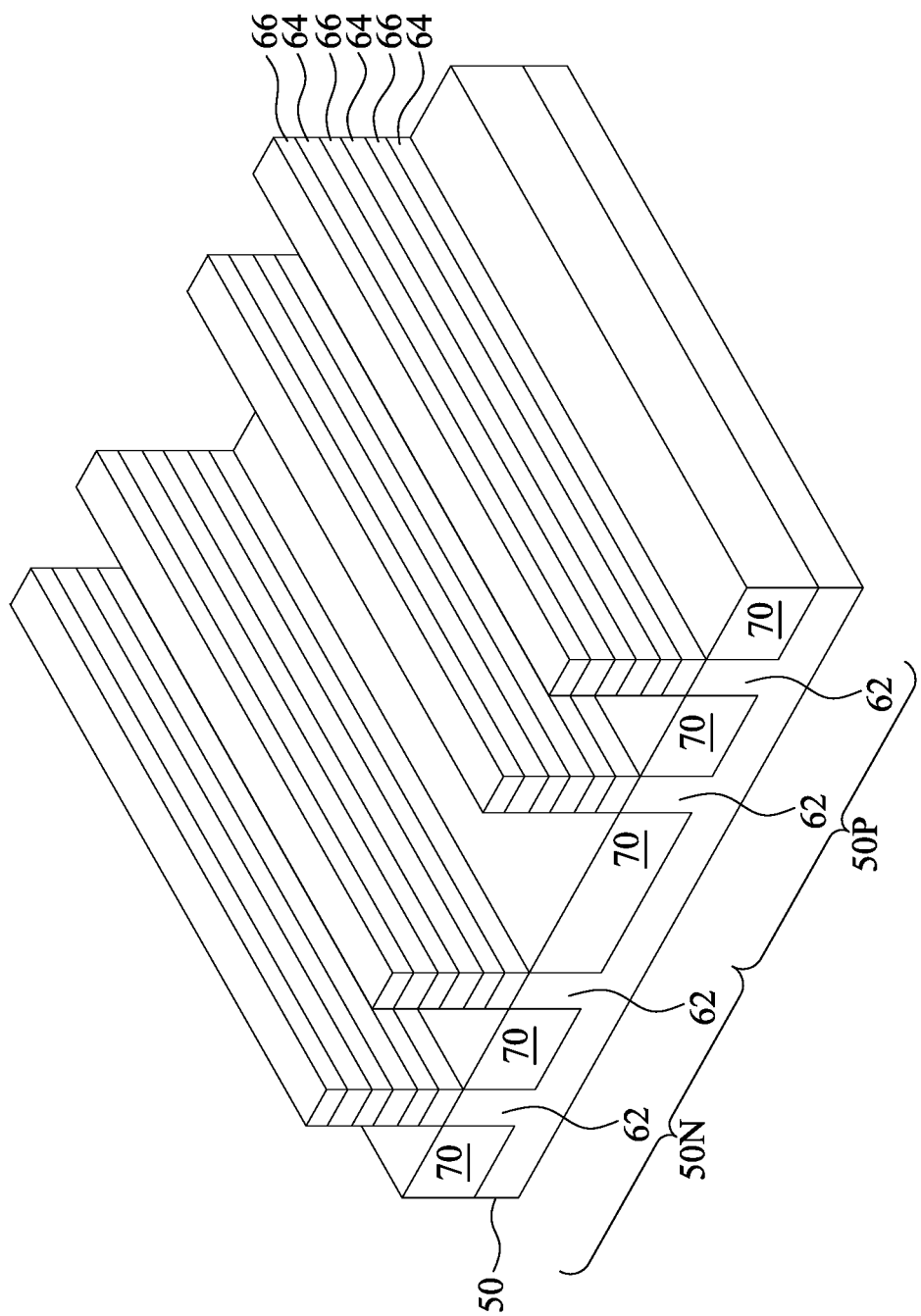

In FIG. 4, STI regions 70 are formed over the substrate 50 and between adjacent fins 62. The STI regions 70 are disposed around at least a portion of the fins 62 such that the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, and may be formed by a chemical vapor deposition (CVD) process, such as high density plasma CVD (HDP-CVD), flowable CVD (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using an acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the substrate 50, the fins 62, and/or the nanostructures 64, 66. In some embodiments, a p-type well may be formed in the n-type region 50N, and a n-type well may be formed in the p-type region 50P. In some embodiments, p-type well or a n-type well are formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ cm$^{-3}$ to about $10^{14}$ cm$^{-3}$. After the implant, the photoresist may be removed, such as by an acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
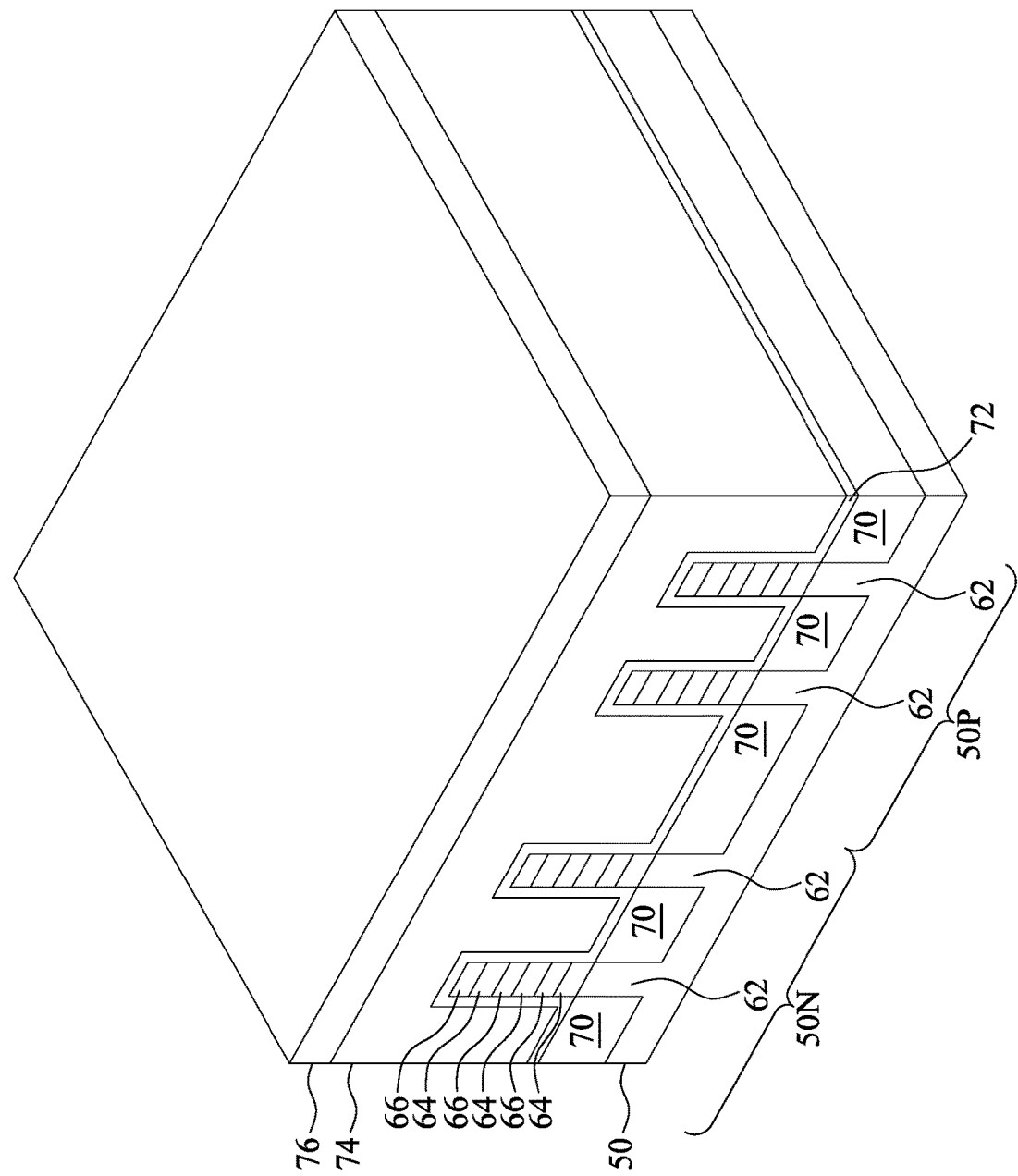

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
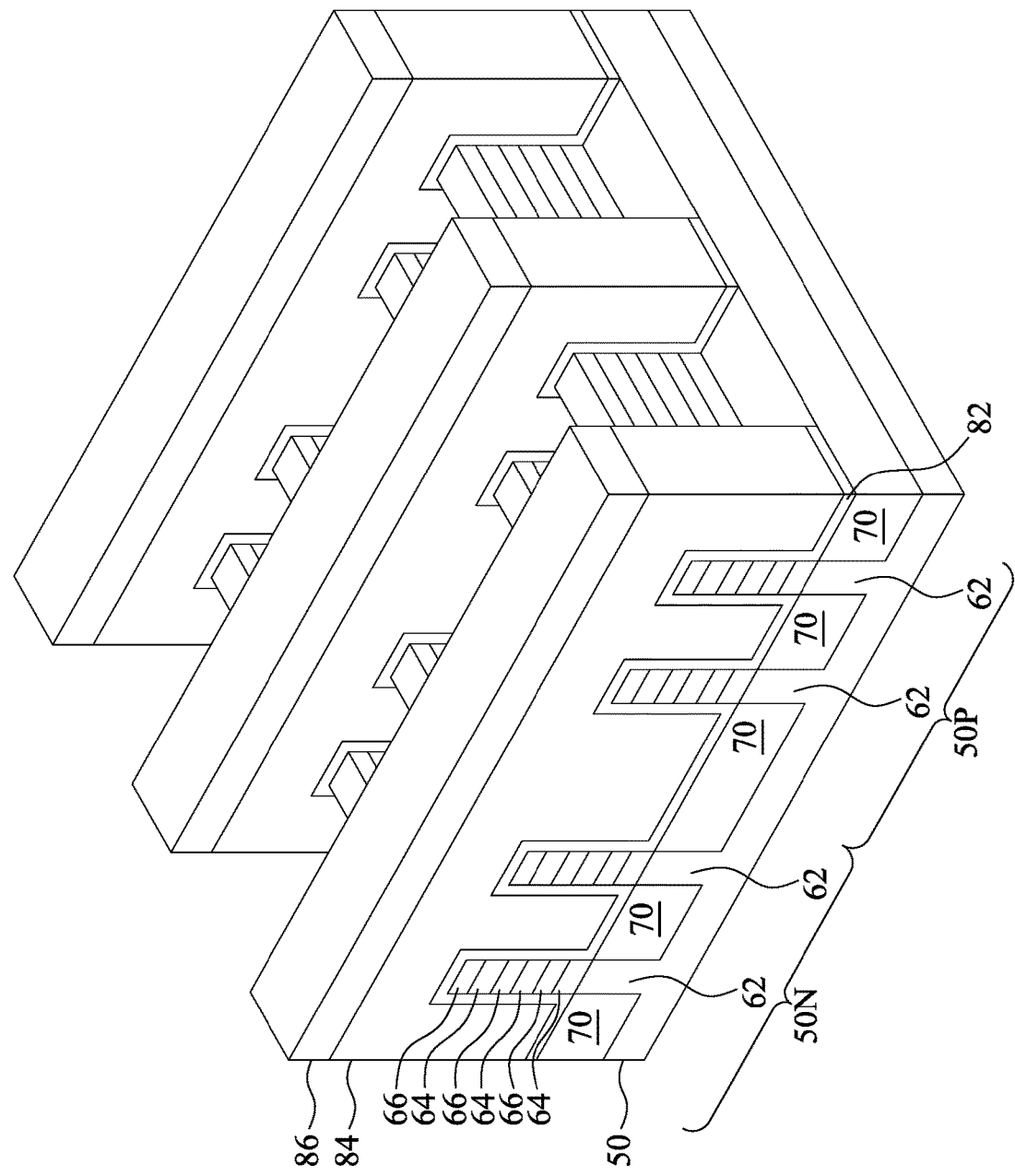

In FIG. 6, the mask layer 76 is patterned using acceptable photolithography and etching techniques to form masks 86. The pattern of the masks 86 is then transferred to the dummy gate layer 74 by an acceptable etching technique to form dummy gates 84. The pattern of the masks 86 may optionally be further transferred to the dummy dielectric layer 72 by an acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by an acceptable etching technique.

FIGS. 7A through 22B illustrate various additional steps in the manufacturing of embodiment devices. FIGS. 7A through 13B and FIGS. 20A through 22B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 7B:
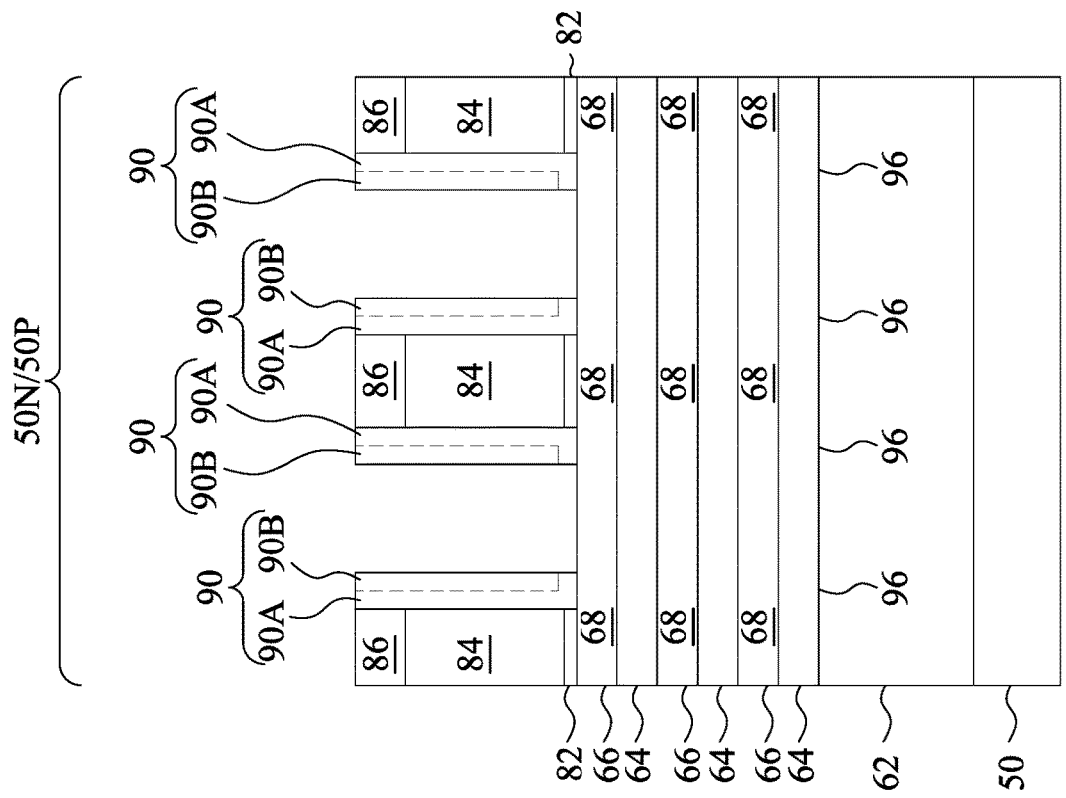
Figure 7A:
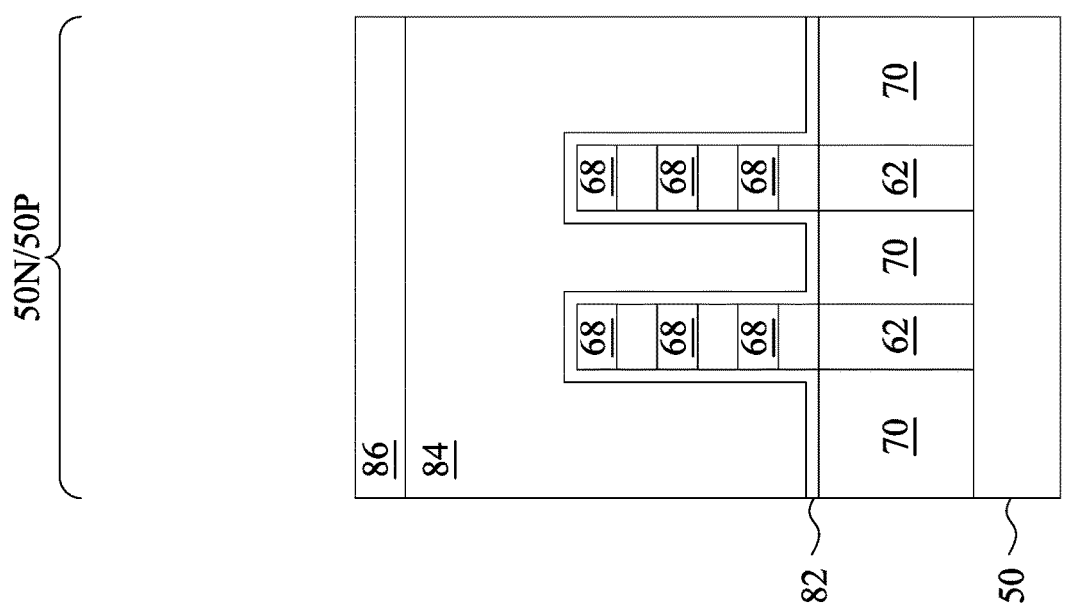

In FIGS. 7A and 7B, gate spacers 90 are formed over the nanostructures 64, 66, on exposed sidewalls of the masks 86 (if present), the dummy gates 84, and the dummy dielectrics 82. The gate spacers 90 may be formed by conformally depositing one or more dielectric material(s) and subsequently etching the dielectric material(s). Acceptable dielectric materials include oxides such as silicon oxide or aluminum oxide; nitrides such as silicon nitride; carbides such as silicon carbide; combinations thereof such as silicon oxynitride, silicon oxycarbide, silicon carbonitride, or silicon oxycarbonitride; or the like. The dielectric materials may be formed by a conformal deposition process such as chemical vapor deposition (CVD), plasma enhanced chemical vapor deposition (PECVD), atomic layer deposition (ALD), or the like. In the illustrated embodiment, the gate spacers 90 each include multiple layers, e.g., a first spacer layer 90A and a second spacer layer 90B. In some embodiments, the first spacer layers 90A and the second spacer layers 90B are formed of silicon oxycarbonitride (e.g., $SiO_xN_yC_{1-x-y}$, where x and y are in the range of 0 to 1). For example, the first spacer layers 90A can be formed of a similar or a different composition of silicon oxycarbonitride than the second spacer layers 90B. An acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). After etching, the gate spacers 90 can have straight sidewalls (as illustrated) or can have curved sidewalls (not separately illustrated). As will be subsequently described in greater detail, the dielectric material(s), when etched, may also have portions left on the sidewalls of the fins 62 and/or the nanostructures 64, 66 (thus forming fin spacers).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of about $10^{15}$ cm$^{-3}$ to about $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8B:
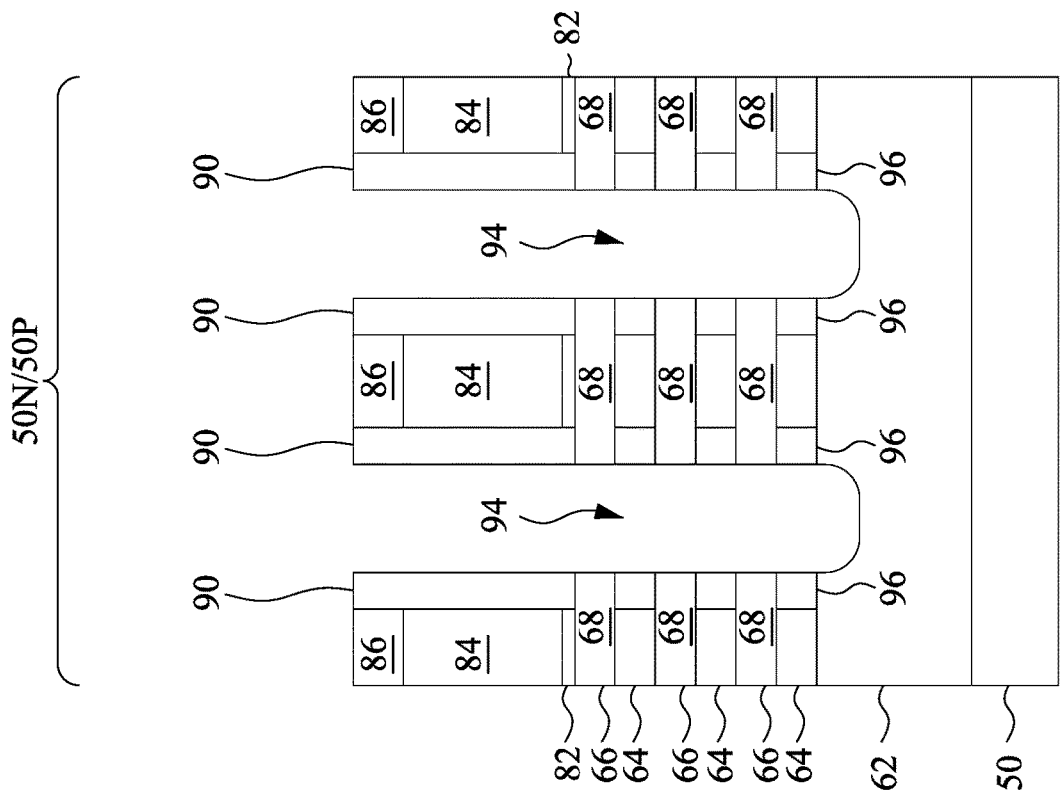
Figure 8A:
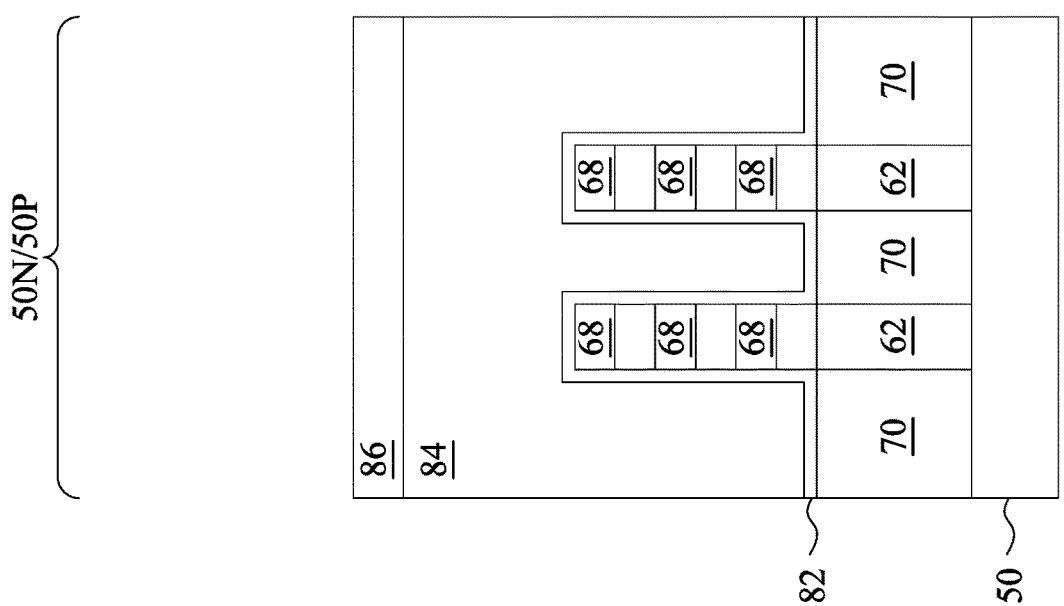

In FIGS. 8A and 8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etching processes, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by an acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 9B:
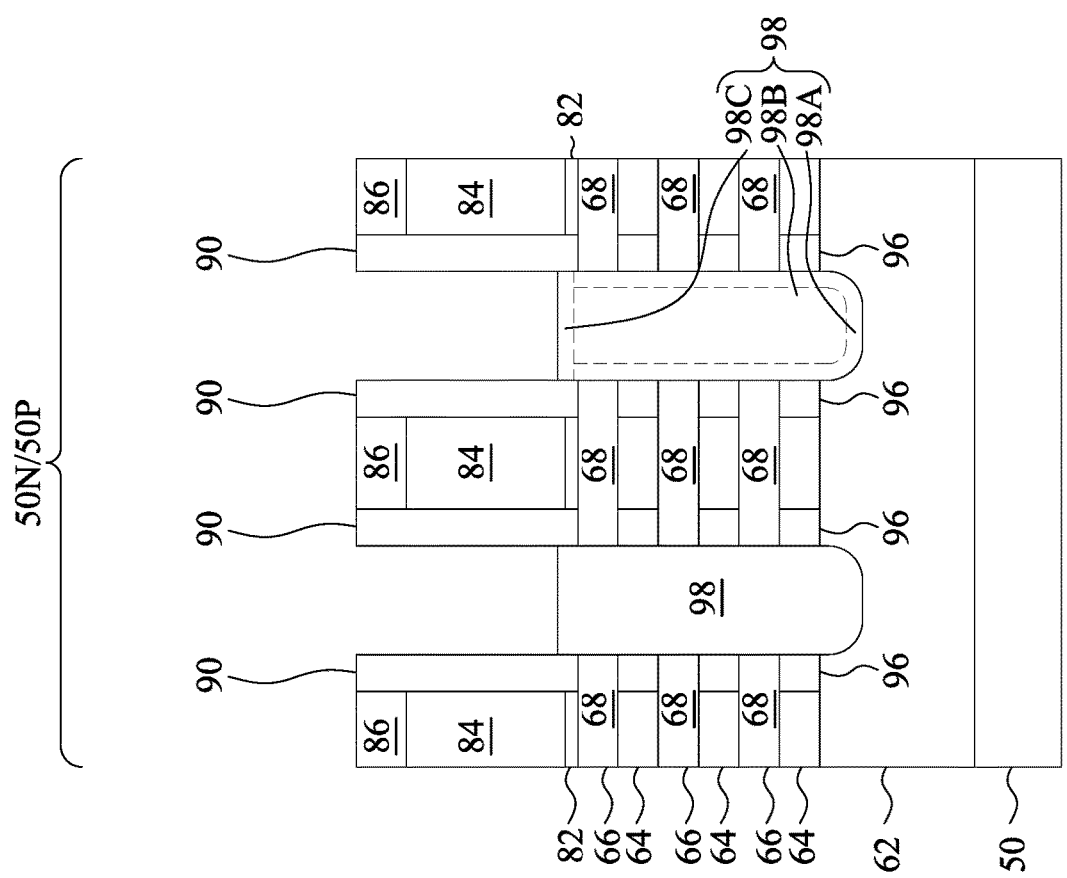
Figure 9A:
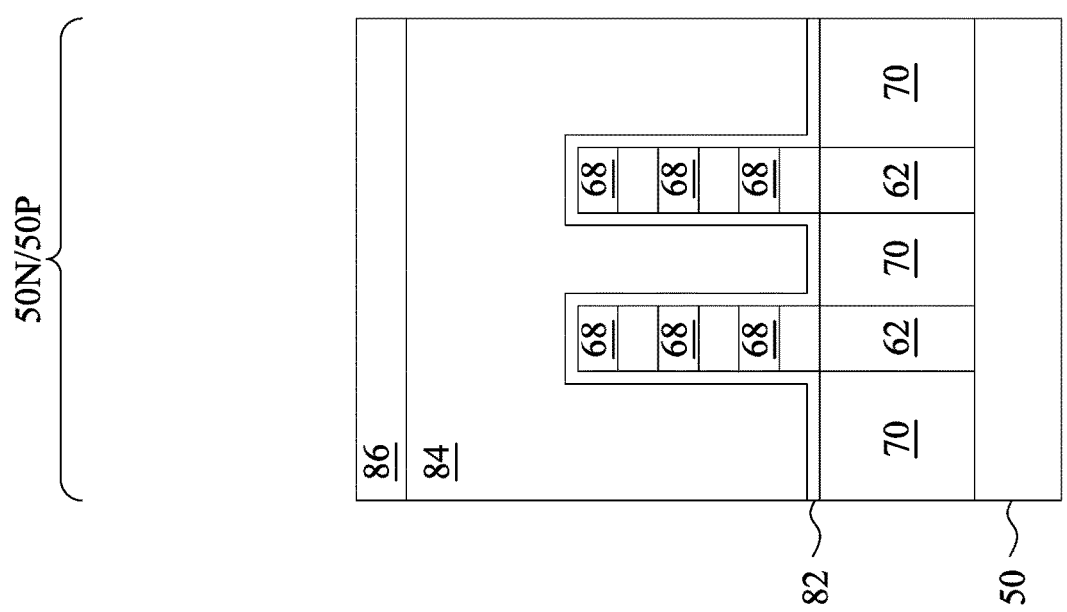
Figure 9C:
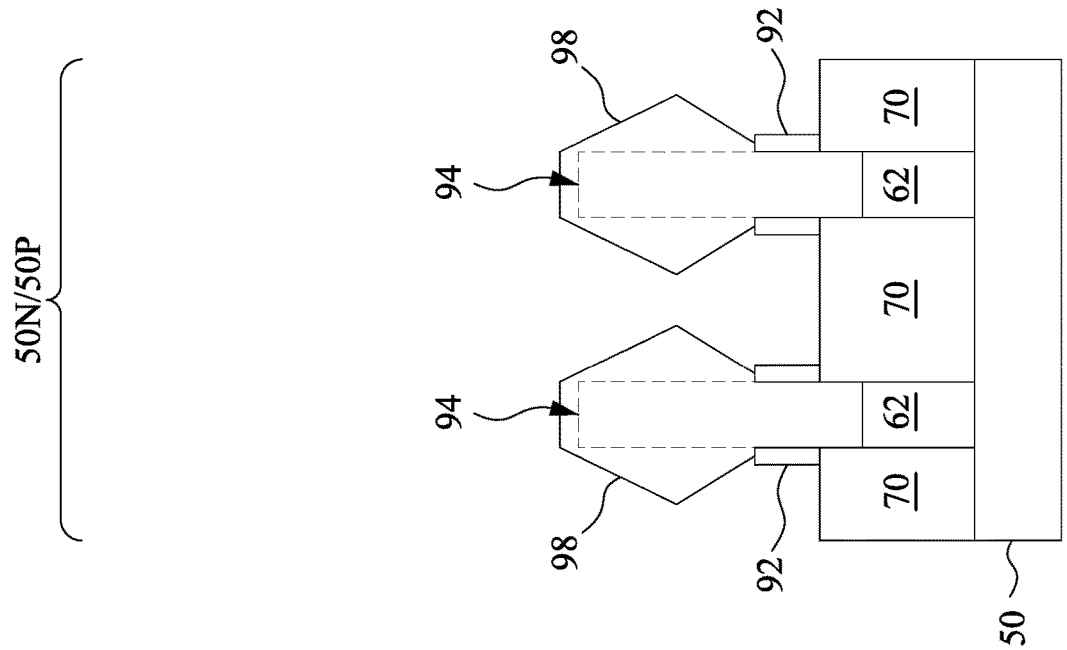
Figure 9D:
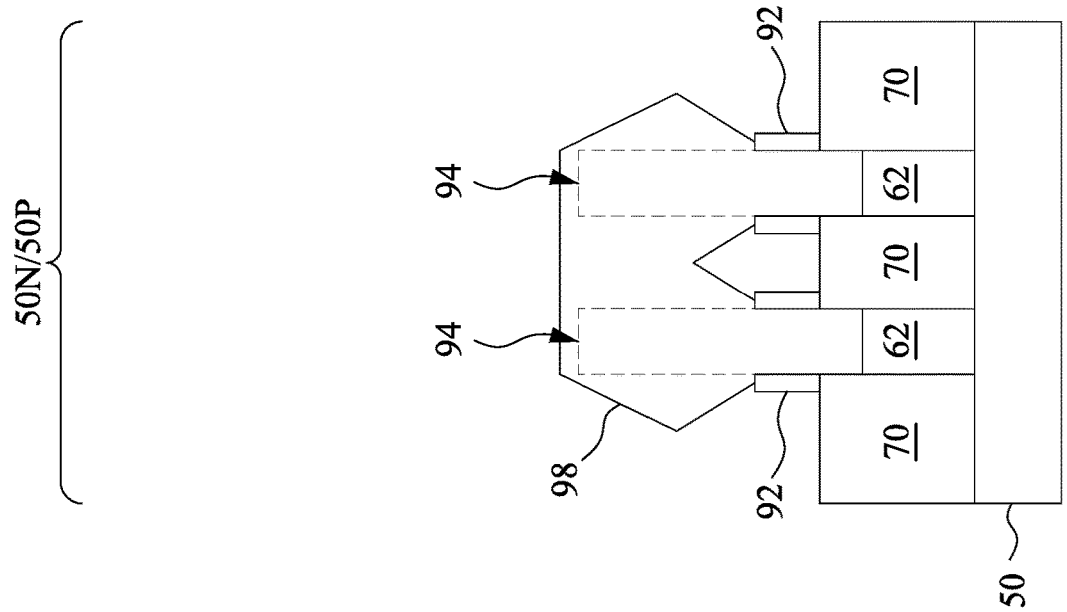

In FIGS. 9A and 9B, epitaxial source/drain regions 98 are formed in the source/drain recesses 94. The epitaxial source/drain regions 98 are formed in the source/drain recesses 94 such that each dummy gate 84 (and its corresponding channel regions 68) is disposed between respective adjacent pairs of the epitaxial source/drain regions 98. In some embodiments, the gate spacers 90 are used to separate the epitaxial source/drain regions 98 from the dummy gates 84 and the inner spacers 96 are used to separate the epitaxial source/drain regions 98 from the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type nano-FETs. For example, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type nano-FETs. For example, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with dopants to form source/drain regions, similar to the process previously described for forming LDD regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different dopant concentrations. In some embodiments, the liner layer 98A may have a dopant concentration less than the main layer 98B, and the finishing layer 98C may have a dopant concentration greater than the liner layer 98A and less than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
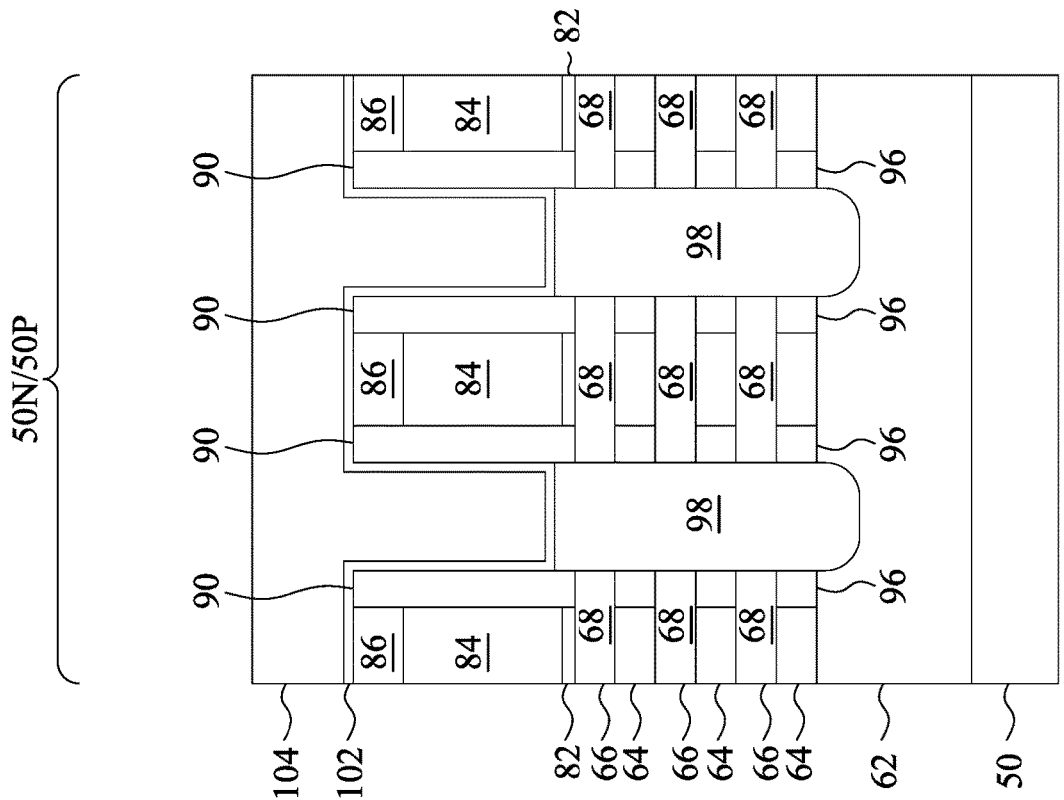
Figure 10A:
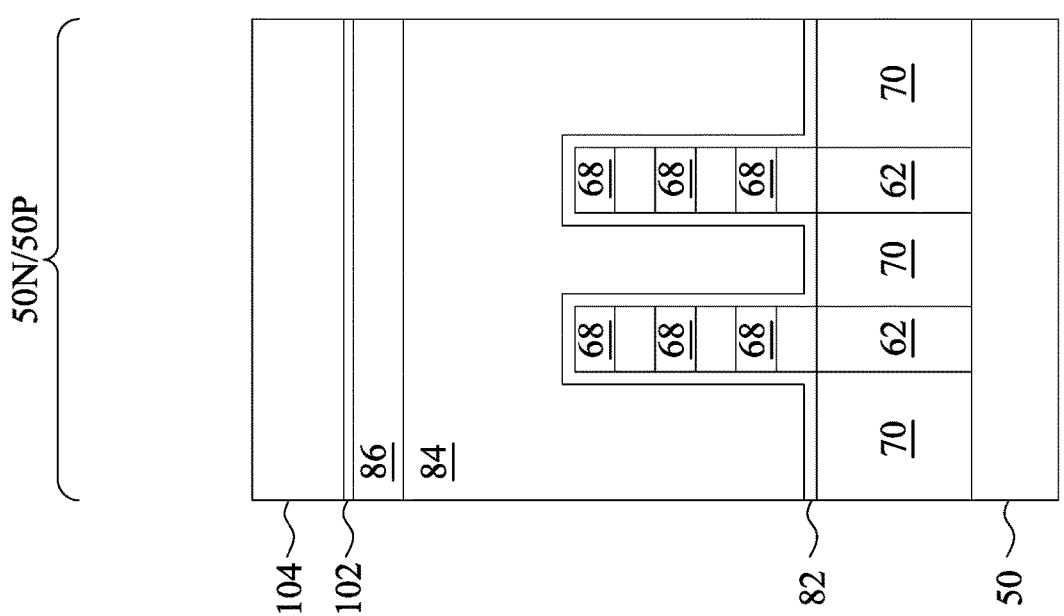

In FIGS. 10A and 10B, a first ILD 104 is deposited over the epitaxial source/drain regions 98, the gate spacers 90, the masks 86 (if present) or the dummy gates 84. The first ILD 104 may be formed of a dielectric material, and may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Figure 11B:
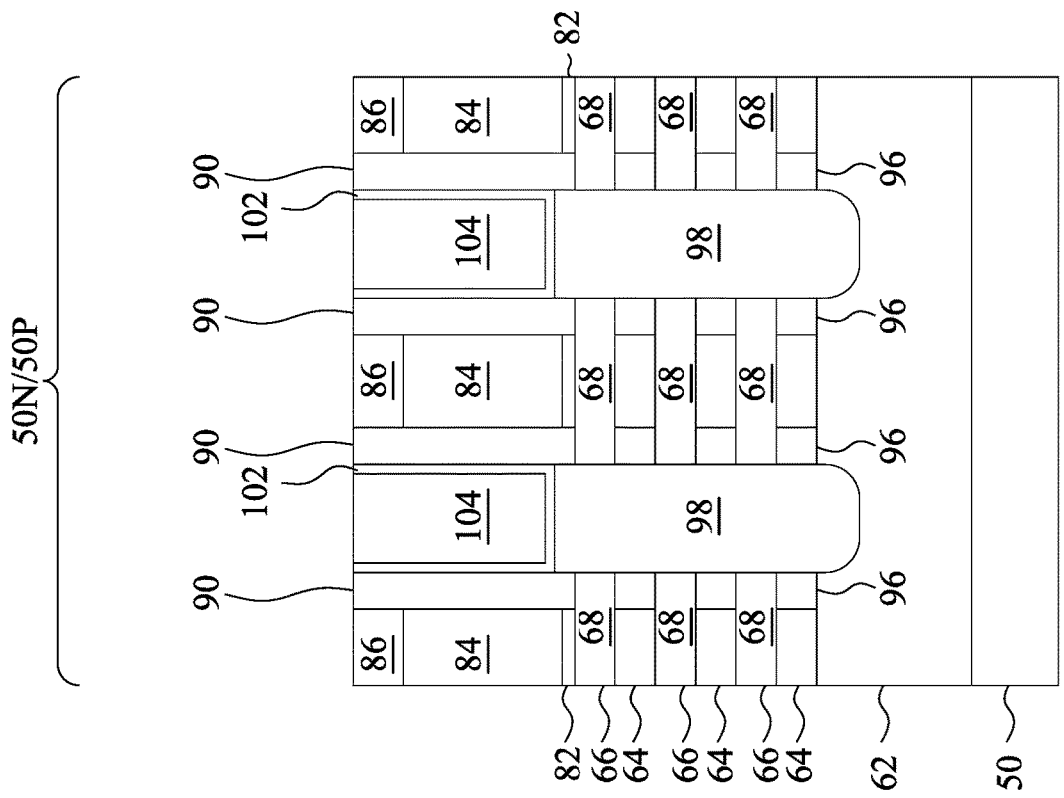
Figure 11A:
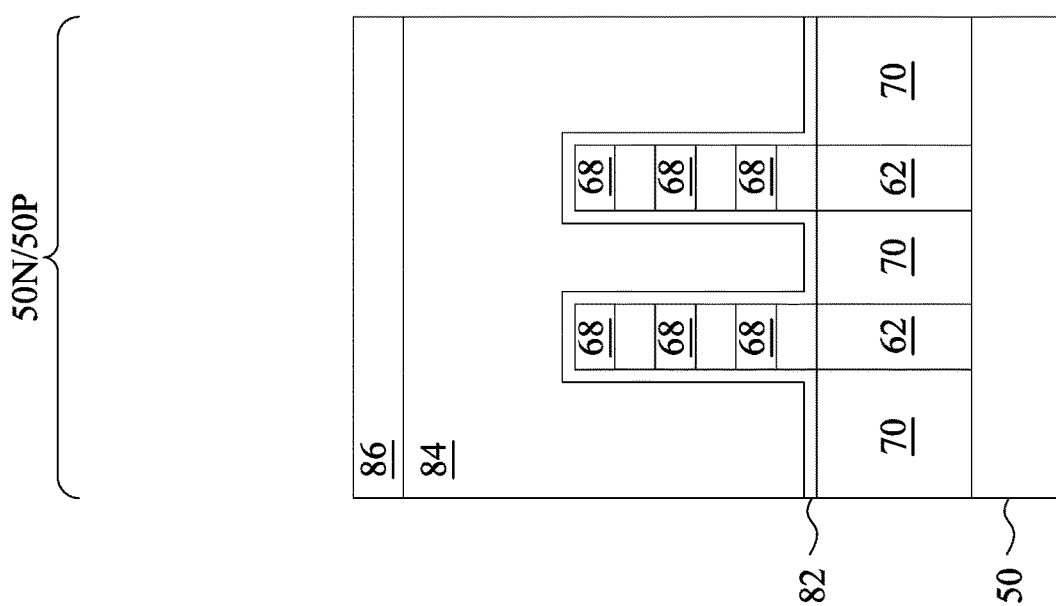

In FIGS. 11A and 11B, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
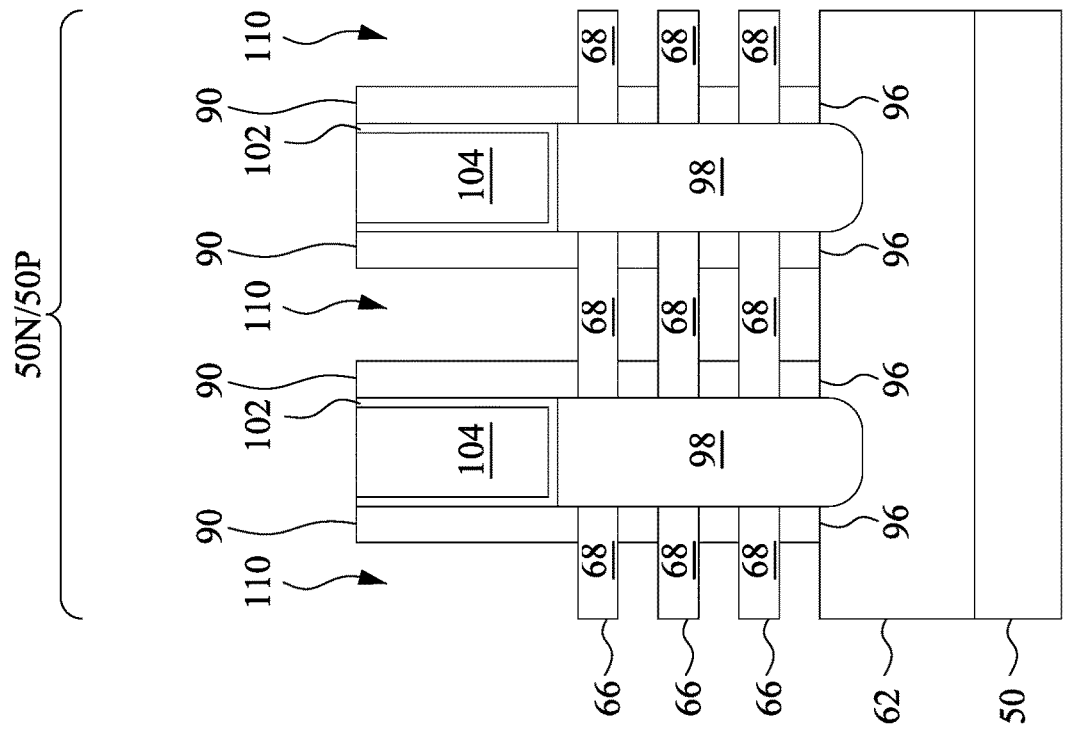
Figure 12A:
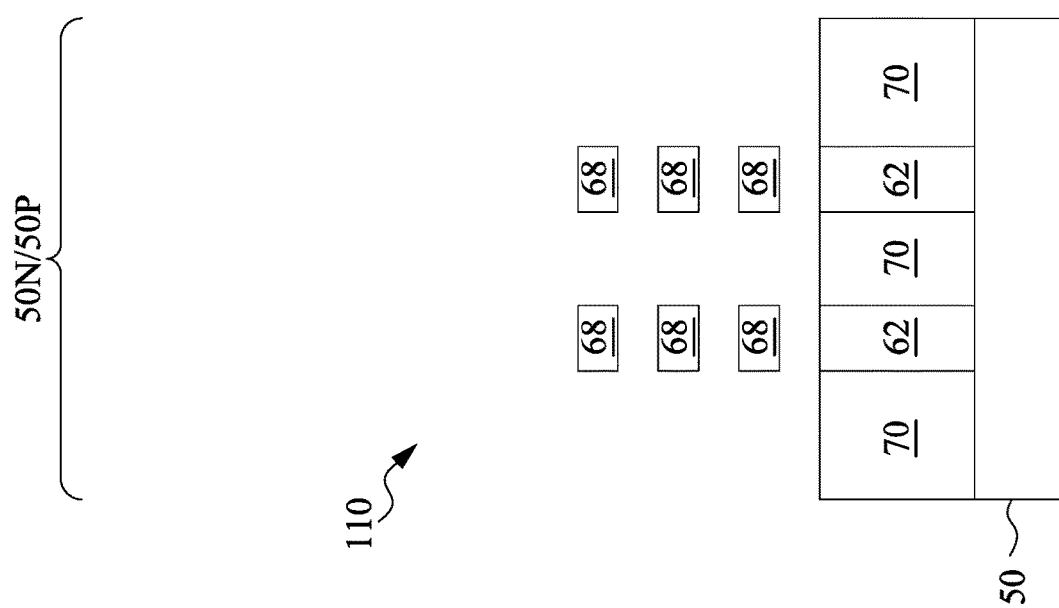

In FIGS. 12A and 12B, the masks 86 (if present) and the dummy gates 84 are removed in an etching process, so that recesses 110 are formed. Portions of the dummy dielectrics 82 in the recesses 110 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 110 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 110. The remaining portions of the first nanostructures 64 can be removed by an acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide ($NH_4OH$), or the like. In some embodiments, a trim process (not separately illustrated) is performed to reduce the thicknesses of the exposed portions of the second nanostructures 66. As illustrated more clearly in FIGS. 14 through 19 (subsequently described in greater detail), the remaining portions of the second nanostructures 66 can have rounded corners.

Figure 13B:
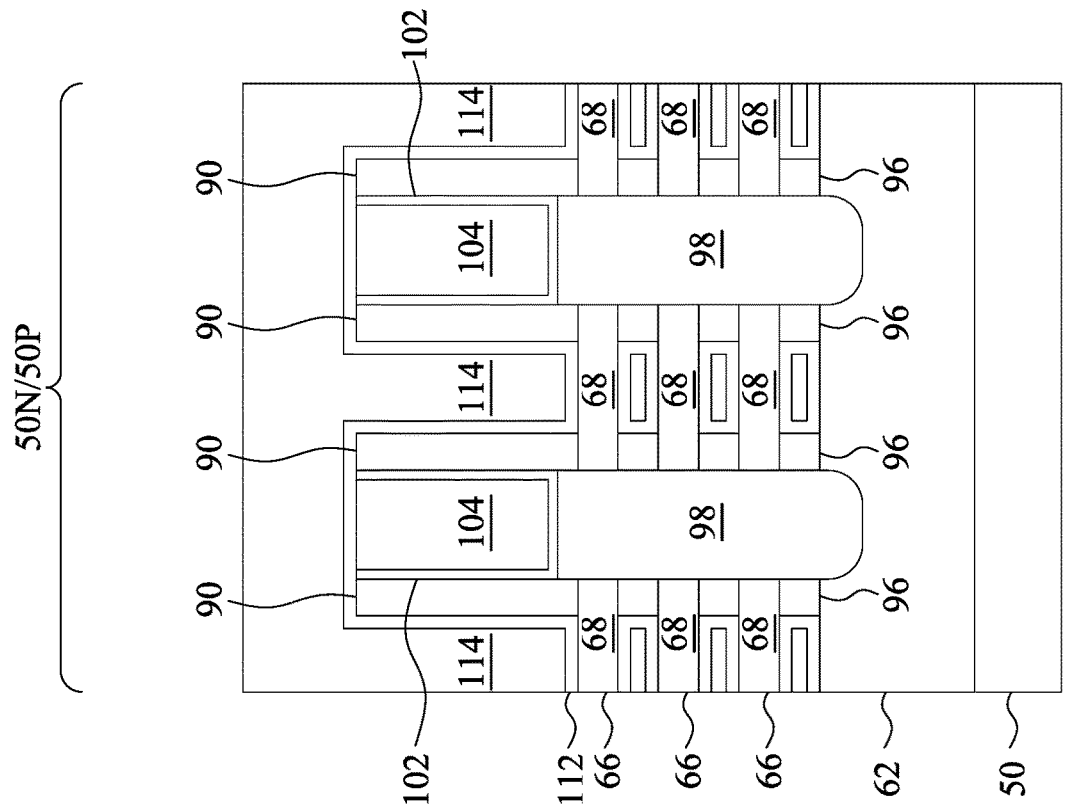
Figure 13A:
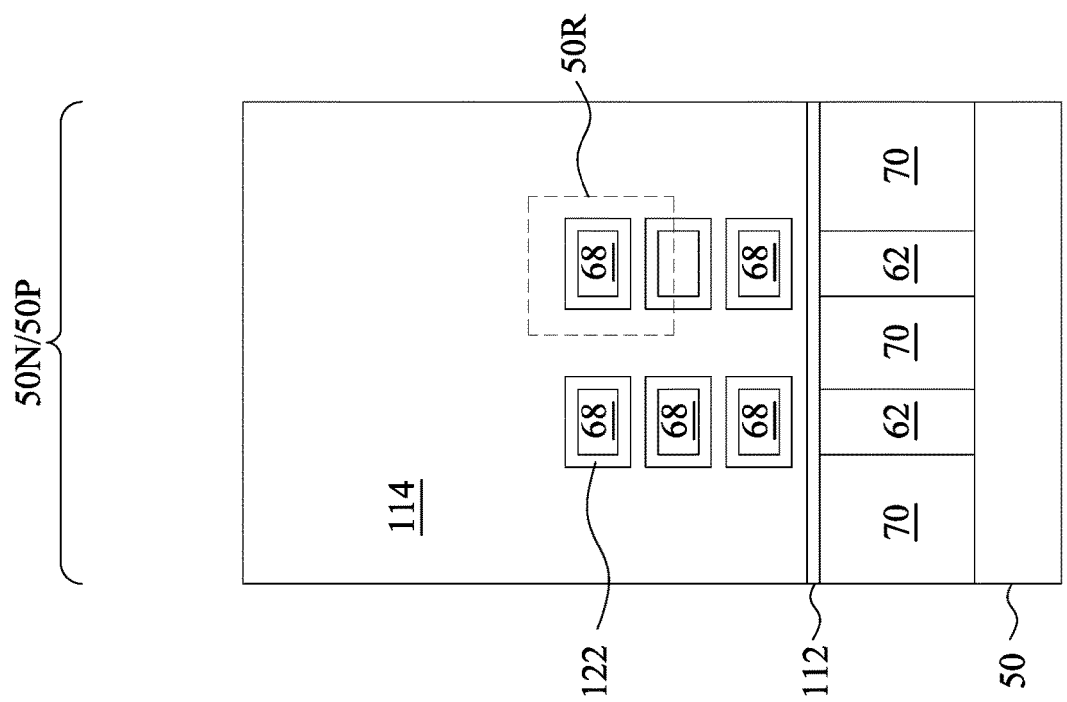

In FIGS. 13A and 13B, a gate dielectric layer 112 is formed in the recesses 110. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than about 7.0, such as a metal oxide or a silicate of hafnium, aluminum, zirconium, lanthanum, manganese, barium, titanium, lead, and combinations thereof. Although a single layered gate dielectric layer 112 is illustrated in FIGS. 13A and 13B, as will be subsequently described in greater detail, the gate dielectric layer 112 may include an interfacial layer and a main layer.

The gate electrode layer 114 may include a metal-containing material such as titanium nitride, titanium oxide, tantalum nitride, tantalum carbide, cobalt, ruthenium, aluminum, tungsten, combinations thereof, multi-layers thereof, or the like. Although a single layered gate electrode layer 114 is illustrated in FIGS. 13A and 13B, as will be subsequently described in greater detail, the gate electrode layer 114 may include any number of work function tuning layers, any number of glue layers, and a fill material.

The formation of the gate dielectric layers 112 in the n-type region 50N and the p-type region 50P may occur simultaneously such that the gate dielectric layers 112 in each region are formed from the same materials, and the formation of the gate electrode layers 114 may occur simultaneously such that the gate electrode layers 114 in each region are formed from the same materials. In some embodiments, the gate dielectric layers 112 in each region may be formed by distinct processes, such that the gate dielectric layers 112 may be different materials and/or have a different number of layers, and/or the gate electrode layers 114 in each region may be formed by distinct processes, such that the gate electrode layers 114 may be different materials and/or have a different number of layers. Various masking steps may be used to mask and expose appropriate regions when using distinct processes. In the following description, the gate electrode layers 114 in the n-type region 50N and the gate electrode layers 114 in the p-type region 50P are formed separately.

Figure 23:
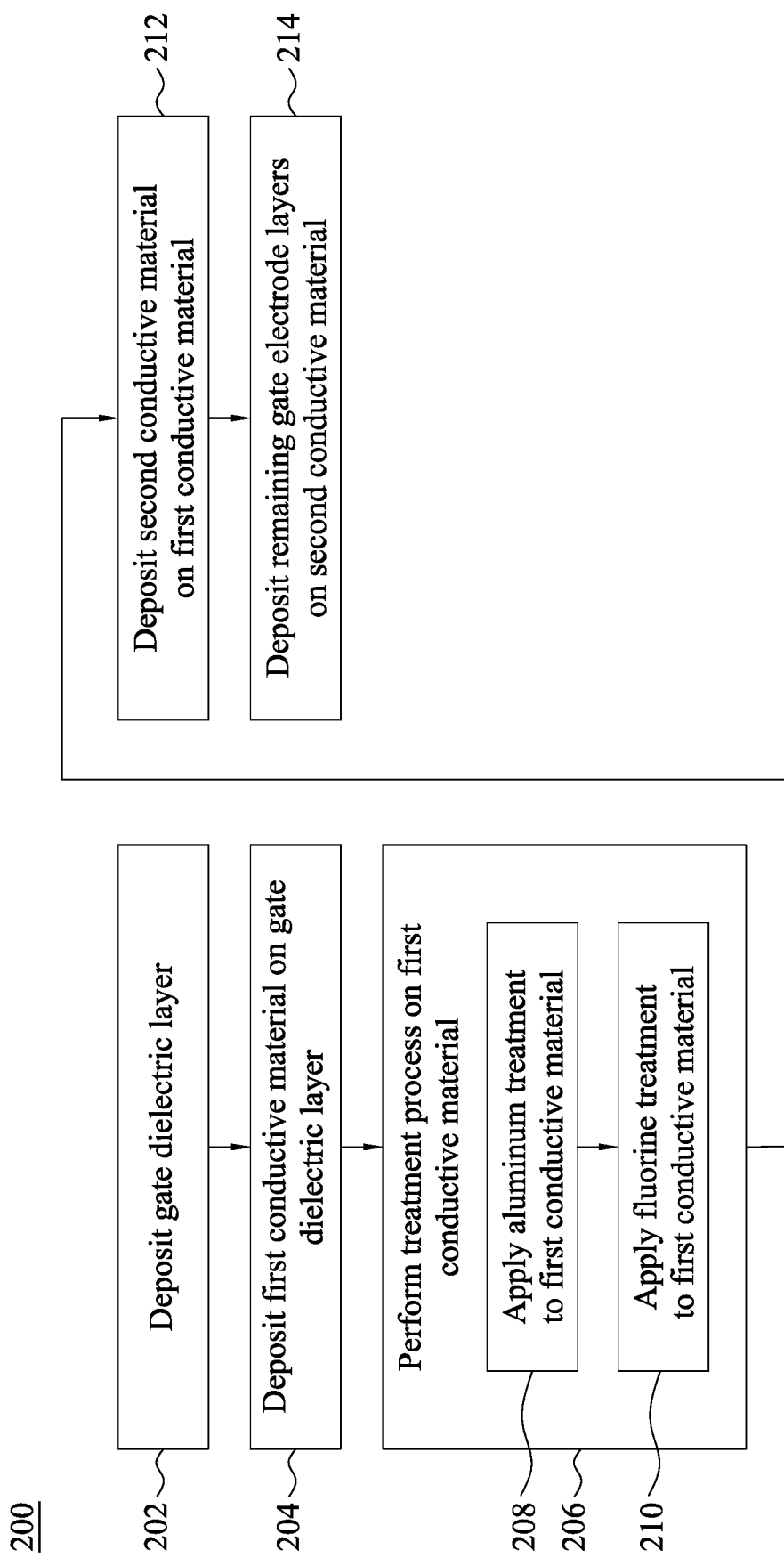
FIG. 23 is a flow chart of an example method for forming replacement gates for nano-FETs, in accordance with some embodiments.

FIGS. 14 through 19 illustrate a process in which gate dielectric layers 112 and gate electrode layers 114 for replacement gates are formed in the recesses 110 in the p-type region 50P. Features in regions that are similar to a region 50R in FIG. 13A are illustrated. FIG. 23 is a flow chart of an example method 200 for forming the replacement gate layers in the p-type region 50P, in accordance with some embodiments. FIGS. 14 through 19 are described in conjunction with FIG. 23. The gate electrode layers 114 include a WFM layer that has been treated with fluorine. The treatment process includes soaking the WFM layer in an aluminum-containing precursor and then subsequently soaking the WFM layer in a fluorine-containing precursor. As a result of the fluorine treatment, a flatband voltage ($V_{FB}$) of the resulting transistor can be increased towards a band edge of the metal of the WFM layer, a threshold voltage of the resulting transistor can be decreased, and device performance may be improved. The n-type region 50N may be masked at least while forming the gate electrode layers 114 in the p-type region 50P.

In FIG. 14 and step 202 of the method 200, the gate dielectric layer 112 is deposited in the recesses 110 in the p-type region 50P. The formation methods of the gate dielectric layer 112 may include molecular-beam deposition (MBD), ALD, PECVD, and the like. The gate dielectric layer 112 wraps around all (e.g., four) sides of the second nanostructures 66. In the illustrated embodiment, the gate dielectric layer 112 is multi-layered, including a first gate dielectric layer 112A (e.g., an interfacial layer) and an overlying second gate dielectric layer 112B (e.g., a high-k dielectric layer). The first gate dielectric layer 112A may be formed of silicon oxide and the second gate dielectric layer 112B may be formed of hafnium oxide.

Figure 15:
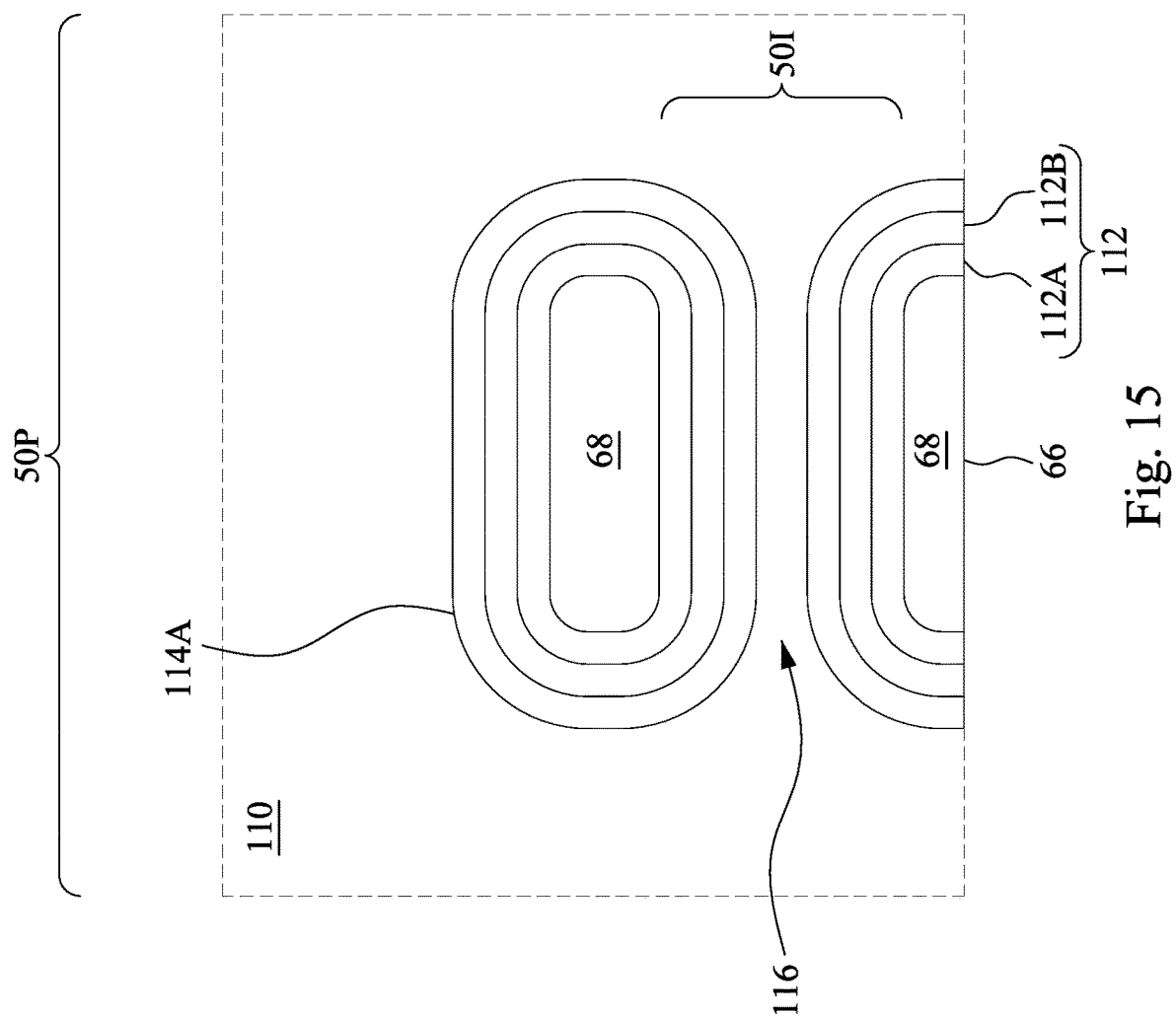

In FIG. 15 and step 204 of the method 200, a layer of a first conductive material 114A is deposited conformally on the gate dielectric layer 112 in the p-type region 50P. The first conductive material 114A is a p-type work function metal (PWFM) such as titanium nitride, tantalum nitride, titanium silicon nitride, tungsten nitride, molybdenum nitride, or the like, which may be deposited by CVD, ALD, PECVD, PVD, or the like. Thus, the layer of the first conductive material 114A may be referred to as a work function tuning layer. The first conductive material 114A can have a thickness in the range of about 10 Å to about 20 Å. The first conductive material 114A may be deposited to surround each of the second nanostructures 66. After the first conductive material 114A is deposited, openings 116 may remain in regions 501 between the second nanostructures 66.

Figure 16:
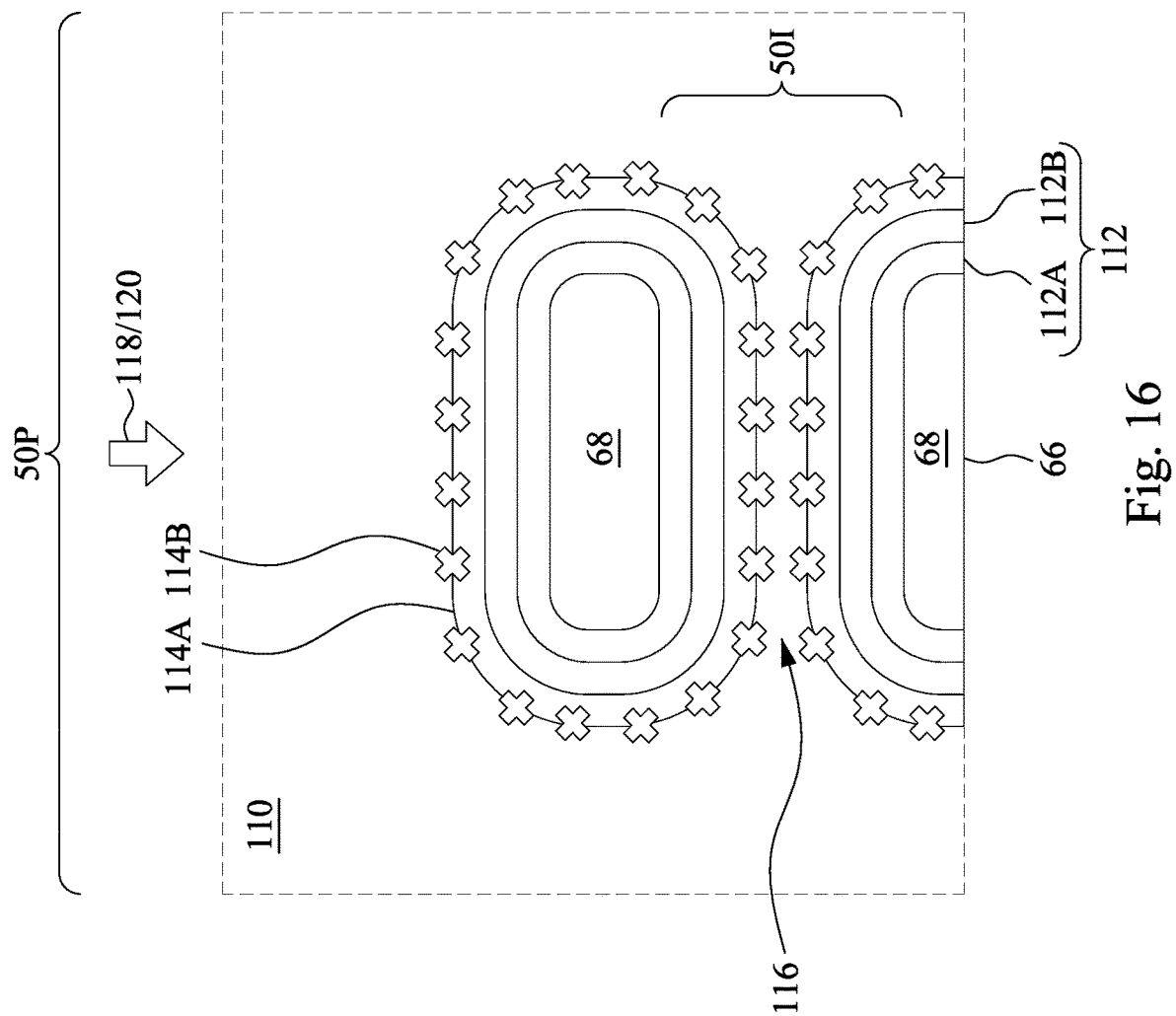

In FIG. 16 and step 206 of the method 200, a treatment process is performed on the exposed surfaces of the first conductive material 114A. The treatment process includes an aluminum treatment 118 and a fluorine treatment 120. The fluorine treatment 120 incorporates fluorine into the first conductive material 114A and (optionally) the second gate dielectric layer 112B. As will be subsequently described in greater detail, the aluminum treatment 118 increases the effectiveness of the fluorine treatment 120 so that more fluorine is incorporated into the second gate dielectric layer 112B and/or the first conductive material 114A as compared to other treatment processes.

In step 208 of the method 200, the aluminum treatment 118 is applied to the first conductive material 114A. In some embodiments, the aluminum treatment 118 is a deposition process (e.g., an ALD process, and CVD process, or the like) that includes flowing an aluminum-containing precursor over surfaces of the first conductive material 114A. Specifically, the aluminum treatment 118 may be performed by placing the substrate 50 in a deposition chamber and dispensing the aluminum-containing precursor into the deposition chamber. In some embodiments, the aluminum-containing precursor is an organo aluminium such as triethylaluminium (TEA) ($Al_2(C_2H_5)_6$), trimethylaluminium (TMA) ($Al_2(CH_3)_6$), or the like. During the aluminum treatment 118, aluminum dissociates from the aluminum-containing precursor and is incorporated into the first conductive material 114A, while the other group (e.g., ethyl group, methyl group, etc.) to which the aluminum is bonded dissociates from the aluminum-containing precursor and is evacuated from the deposition chamber. As a result of the aluminum treatment 118, the first conductive material 114A may include aluminum at a concentration in a range of about 0.5 at. % to about 25 at. %.

The aluminum treatment 118 may be performed at a temperature in a range of about 250° C. to about 475° C., such as by maintaining the deposition chamber at a temperature in this range. Performing the aluminum treatment 118 at a temperature in this range incorporates a desired quantity of aluminum into the first conductive material 114A so that a sufficient quantity of sites to which fluorine may bond are created. Performing the aluminum treatment 118 at a temperature outside of this range may not incorporate the desired quantity of aluminum into the first conductive material 114A. When the temperature of the aluminum treatment 118 is less than 250° C., the aluminum-containing precursor does not properly dissociate and create a sufficient quantity of sites to which fluorine may bond in the first conductive material 114A. When the temperature of the aluminum treatment 118 is greater than 475° C., the amount of aluminum that dissociates from the aluminum-containing precursor may be too large to be precisely controlled.

The aluminum treatment 118 may be performed for a duration in a range of about 1 second to about 15 minutes, such as by flowing the aluminum-containing precursor in the deposition chamber for a duration in this range. Performing the aluminum treatment 118 for a duration in this range incorporates a desired quantity of aluminum into the first conductive material 114A so that a sufficient quantity of sites to which fluorine may bond are created. Performing the aluminum treatment 118 for a duration outside of this range may not incorporate the desired quantity of aluminum into the first conductive material 114A. When the aluminum treatment 118 is performed for less than about 1 second, an insufficient quantity of sites to which fluorine may bond are created in the first conductive material 114A. When the aluminum treatment 118 is performed for greater than about 15 minutes, an excessive amount of aluminum may be introduced into the device, undesirably altering the threshold voltage of the resulting transistor.

In some embodiments, the aluminum treatment 118 is a deposition process that uses a single chemical (e.g., TEA, TMA, or the like) without another chemical that would trigger a reduction-oxidation reaction. Therefore, the aluminum treatment 118 does not deposit a continuous film on the first conductive material 114A. However, as will be subsequently described in greater detail, discrete pockets of aluminum residue may be formed on the top surface of the first conductive material 114A.

In other embodiments, residue from the aluminum treatment 118 may not be formed on the first conductive material 114A. For example, FIG. 24 illustrates an embodiment where aluminum residue is not formed. Rather, the aluminum may diffuse into the first conductive material 114A.

In some embodiments, the aluminum treatment 118 does not result in aluminum diffusion into the underlying gate dielectric layer 112, such that the underlying gate dielectric layer 112 (e.g., the second gate dielectric layer 112B) is free from aluminum. In another embodiment, the aluminum treatment 118 may further result in aluminum diffusion into an underlying gate dielectric layer 112 (e.g., the second gate dielectric layer 112B), and aluminum may be observed in the second gate dielectric layer 112B with X-ray photoelectron spectroscopy analysis.

Fluorine readily bonds to aluminum. Incorporating aluminum into the second gate dielectric layer 112B and/or the first conductive material 114A during the aluminum treatment 118 increases the quantity of sites to which fluorine may bond during the fluorine treatment 120. As such, performing the aluminum treatment 118 increases the effectiveness of the fluorine treatment 120.

In step 210 of the method 200 the fluorine treatment 120 is applied to the first conductive material 114A. In some embodiments, the fluorine treatment 120 is a deposition process (e.g., an ALD process, and CVD process, or the like) that includes flowing a fluorine-containing precursor over surfaces of the first conductive material 114A. Specifically, the fluorine treatment 120 may be performed by placing the substrate 50 in a deposition chamber and dispensing the fluorine-containing precursor into the deposition chamber. In some embodiments, the fluorine-containing precursor is $WF_x$, $NF_x$, $TiF_x$, $TaF_x$, $HfF_x$, or the like, where x is an integer in a range of 1 to 6. For example, the fluorine-containing precursor may be $WF_6$ and/or $NF_3$. During the fluorine treatment 120, fluorine dissociates from the fluorine-containing precursor and is incorporated into the first conductive material 114A, bonding to the aluminum that was previously incorporated into the first conductive material 114A. As a result of the fluorine treatment 120, the first conductive material 114A may include fluorine at a concentration in a range of about 2.5 at. % to about 30 at. %.

The fluorine treatment 120 may be performed at a temperature in a range of about 250° C. to about 475° C., such as by maintaining the deposition chamber at a temperature in this range. Performing the fluorine treatment 120 at a temperature in this range affects a desired change in the first conductive material 114A and/or its underlying layers. Performing the fluorine treatment 120 at a temperature outside of this range may not affect the desired change in the first conductive material 114A and/or its underlying layers. When the temperature of the fluorine treatment 120 is less than 250° C., the fluorine-containing precursor does not properly dissociate and affect a desired change in the first conductive material 114A and/or its underlying layers. When the temperature of the fluorine treatment 120 is greater than 475° C., the amount of fluorine that dissociates from the fluorine-containing precursor may be too large to be precisely controlled.

The fluorine treatment 120 may be performed for a duration in a range of about 1 second to about 15 minutes, such as by flowing the fluorine-containing precursor in the deposition chamber for a duration in this range. Performing the fluorine treatment 120 for a duration in this range tunes a threshold voltage of the resulting transistor by a desired amount. Performing the fluorine treatment 120 for a duration outside of this range may not tune the threshold voltage of the resulting transistor by the desired amount. When the fluorine treatment 120 is performed for less than about 1 second, the amount of fluorine introduced by the treatment process may not be sufficient to tune a threshold voltage of the resulting transistor. When the fluorine treatment 120 is performed for greater than about 15 minutes, an excessive amount of fluorine may be introduced into the device, resulting in capacitance equivalent thickness (CET) penalty (e.g., re-growth of the first gate dielectric layer 112A).

In some embodiments, the fluorine treatment 120 is a deposition process that uses a single chemical (e.g., $WF_6$, $NF_3$, or the like) without another chemical that would trigger a reduction-oxidation reaction. Therefore, the fluorine treatment 120 does not deposit a continuous film on the first conductive material 114A. In other embodiments where the fluorine-containing precursor also includes a metal, discrete pockets of a residue of the metal may be formed on the top surface of the first conductive material 114A. In embodiments where the fluorine-containing precursor used during the fluorine treatment 120 is $WF_6$, the residue may be a tungsten residue that is formed on the first conductive material 114A. The treatment process may thus form residue 114B of one or more metals, including residual aluminum of the aluminum-containing precursor used during the aluminum treatment 118 (e.g., aluminum that did not bond to fluorine) and/or residual metal of the fluorine-containing precursor used during the fluorine treatment 120 (e.g., tungsten when the fluorine-containing precursor is $WF_6$). Each pocket of residue 114B may be disconnected from other pockets of residue 114B, and no continuous film is formed on the first conductive material 114A. The residue 114B may be formed on exposed surfaces of the first conductive material 114A, including in regions 501 of the gate structures between the second nanostructures 66. In some embodiments where the residue 114B includes aluminum and tungsten residue and the second gate dielectric layer 112B includes hafnium oxide, a ratio of aluminum to hafnium in the regions 501 may be less than about 0.1 (such as in a range of about 0.005 to about 0.1) or less than about 0.005, and a ratio of tungsten to hafnium in the regions 501 may be less than about 0.1 (such as in a range of about 0.005 to about 0.1) or less than about 0.005. When the ratio of tungsten to hafnium or the ratio of aluminum to hafnium in the regions 501 is greater than about 0.1, the resulting device may not have a desired threshold voltage (e.g., the threshold voltage may be too high).

In other embodiments where the fluorine-containing precursor does not include a metal (e.g., the fluorine-containing precursor is $NF_3$), residue from the fluorine treatment 120 may not be formed on the first conductive material 114A. For example, FIG. 24 illustrates an embodiment where metal residue not formed, and the fluorine-containing precursor used during the fluorine treatment 120 is $NF_3$.

In some embodiments, the fluorine treatment 120 may further result in fluorine diffusion into an underlying gate dielectric layer 112 (e.g., the second gate dielectric layer 112B), and fluorine may be observed in the second gate dielectric layer 112B with X-ray photoelectron spectroscopy analysis. For example, in embodiments where the second gate dielectric layer 112B includes hafnium oxide, a ratio of fluorine to hafnium in the regions 501 (e.g., in the second gate dielectric layer 112B) may be in a range of about 0.015 to about 0.2 as a result of the fluorine treatment 120. When the ratio of fluorine to hafnium in the regions 501 is less than about 0.015, the amount of fluorine may not be sufficient to tune a threshold voltage of the resulting transistor. When the ratio of fluorine to hafnium in the regions 501 is greater than about 0.2, an excessive amount of fluorine may have been introduced into the second gate dielectric layer 112B, resulting in CET penalty (e.g., re-growth of the first gate dielectric layer 112A). As a result of the fluorine treatment 120, the second gate dielectric layer 112B may include fluorine at a concentration in a range of about 2.5 at. % to about 30 at. %.

As noted above, incorporating aluminum into the first conductive material 114A during the aluminum treatment 118 increases the quantity of sites to which fluorine may bond during the fluorine treatment 120. Further, Al—F bonds are more stable than Ti—F bonds, and so the amount of fluorine incorporated into the first conductive material 114A may remain more stable and decrease less over time as compared to other treatment processes. For example, in experimental data, embodiment treatments applying a TEA soak before a $WF_6$ soak increased the fluorine concentration of the first conductive material 114A by as much as 10.8 at. %, allowing for a positive effective work function shift more than about 50 mV.

In some embodiments, the aluminum treatment 118 and the fluorine treatment 120 are performed in situ, e.g., in the same deposition chamber without breaking a vacuum in the deposition chamber between the aluminum treatment 118 and the fluorine treatment 120. For example, performing the treatment process may include: placing the substrate 50 in the deposition chamber; flowing the aluminum-containing precursor into the deposition chamber (thus performing the aluminum treatment 118); evacuating the aluminum-containing precursor from the deposition chamber; flowing the fluorine-containing precursor into the deposition chamber (thus performing the fluorine treatment 120); evacuating the fluorine-containing precursor from the deposition chamber; and removing the substrate 50 from the deposition chamber. In various embodiments, the aluminum treatment 118 and the fluorine treatment 120 are performed at the same temperature and for the same duration; the aluminum treatment 118 and the fluorine treatment 120 are performed at the same temperature and for different durations; the aluminum treatment 118 and the fluorine treatment 120 are performed at different temperatures and for the same duration; or the aluminum treatment 118 and the fluorine treatment 120 are performed at different temperatures and for different durations.

Accordingly, as previously described, in various embodiments a fluorine-treated WFM layer (e.g., the first conductive material 114A) is formed, and during formation of the fluorine-treated WFM layer, fluorine may diffuse into an underlying gate dielectric layer 112 (e.g., the second gate dielectric layer 112B). As a result, the flatband voltage ($V_{FB}$) of the resulting transistor can be increased towards a band edge of the metal of the WFM layer, a threshold voltage of the resulting device can be decreased, and device performance may be improved. For example, in experimental data, embodiment fluorine treatments applying a $WF_6$ soak have resulted in a positive effective work function shift on a metal-oxide-semiconductor capacitor of about 15 mV to about 130 mV after forming gas annealing.

Figure 17:
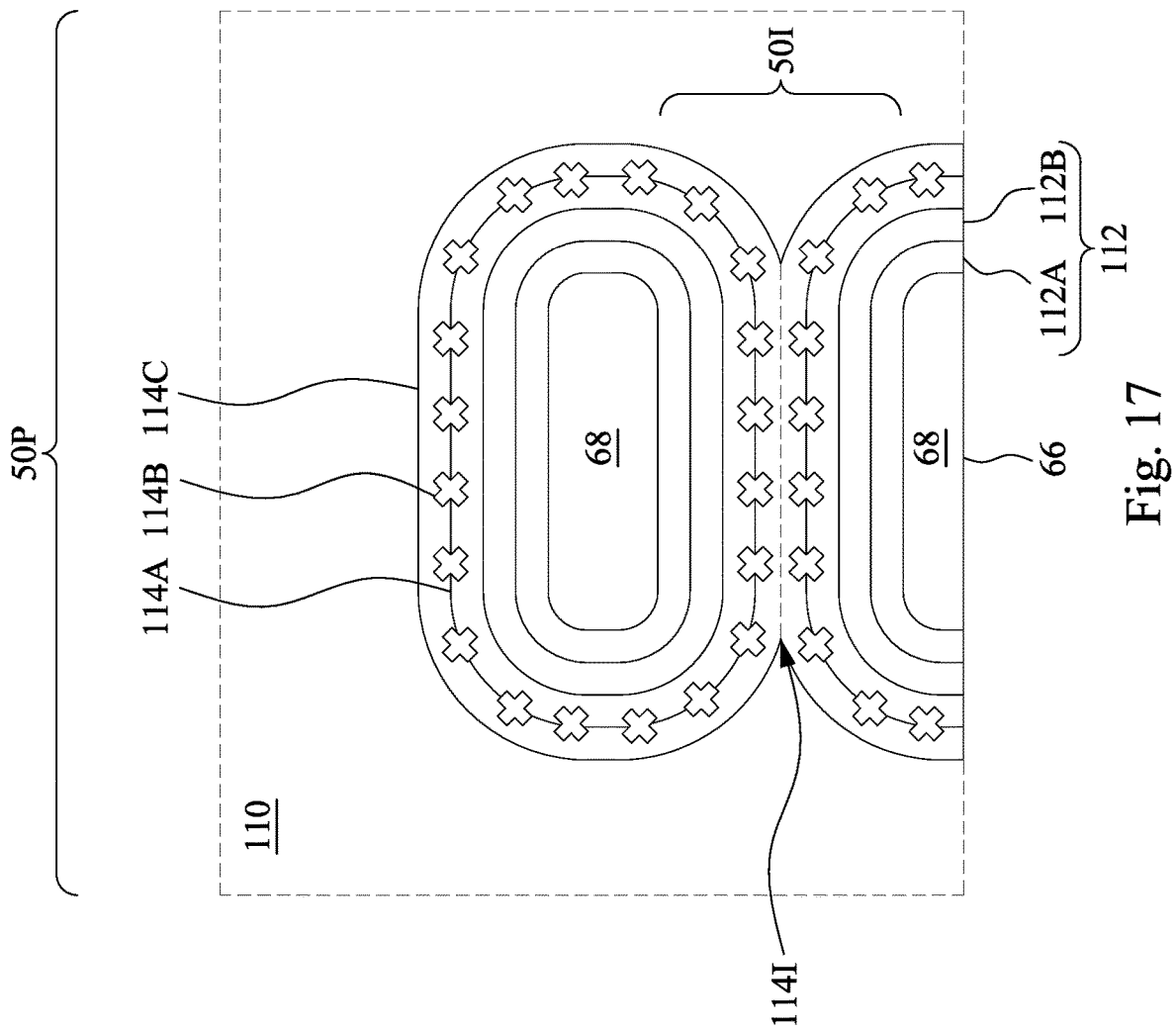

In FIG. 17 and step 212 of the method 200, a layer of a second conductive material 114C is deposited conformally on the residue 114B (if present) and/or the first conductive material 114A. The second conductive material 114C is a p-type work function metal (PWFM) such as titanium nitride, tantalum nitride, titanium silicon nitride, tungsten nitride, molybdenum nitride, or the like, which may be deposited by CVD, ALD, PECVD, PVD, or the like. Thus, the layer of the second conductive material 114C may be referred to as a work function tuning layer. The second conductive material 114C can have a thickness in the range of about 10 Å to about 20 Å. Because the second conductive material 114C is deposited after the aluminum treatment 118 and the fluorine treatment 120, the second conductive material 114C may be free of fluorine and aluminum, or at least may have a lower concentration of fluorine and aluminum than the first conductive material 114A.

In some embodiments, the first conductive material 114A is different from the second conductive material 114C. For example, the first conductive material 114A may be titanium nitride and the second conductive material 114C may be tantalum nitride. In some embodiments, the first conductive material 114A is the same as the second conductive material 114C. For example, the first conductive material 114A and the second conductive material 114C may each be titanium nitride.

The second conductive material 114C may fill a remaining portion of the region 501 between the second nanostructures 66 (e.g., filling the openings 116, see FIGS. 15 and 16). For example, the second conductive material 114C may be deposited on the first conductive material 114A until it merges and seams together, and in some embodiments, an interface 114I may be formed by a first portion of the second conductive material 114C (e.g., a portion of the second conductive material 114C around a second nanostructure 66) touching a second portion of the second conductive material 114C (e.g., an adjacent portion of the second conductive material 114C around an adjacent second nanostructure 66) in the region 501.

Figure 18:
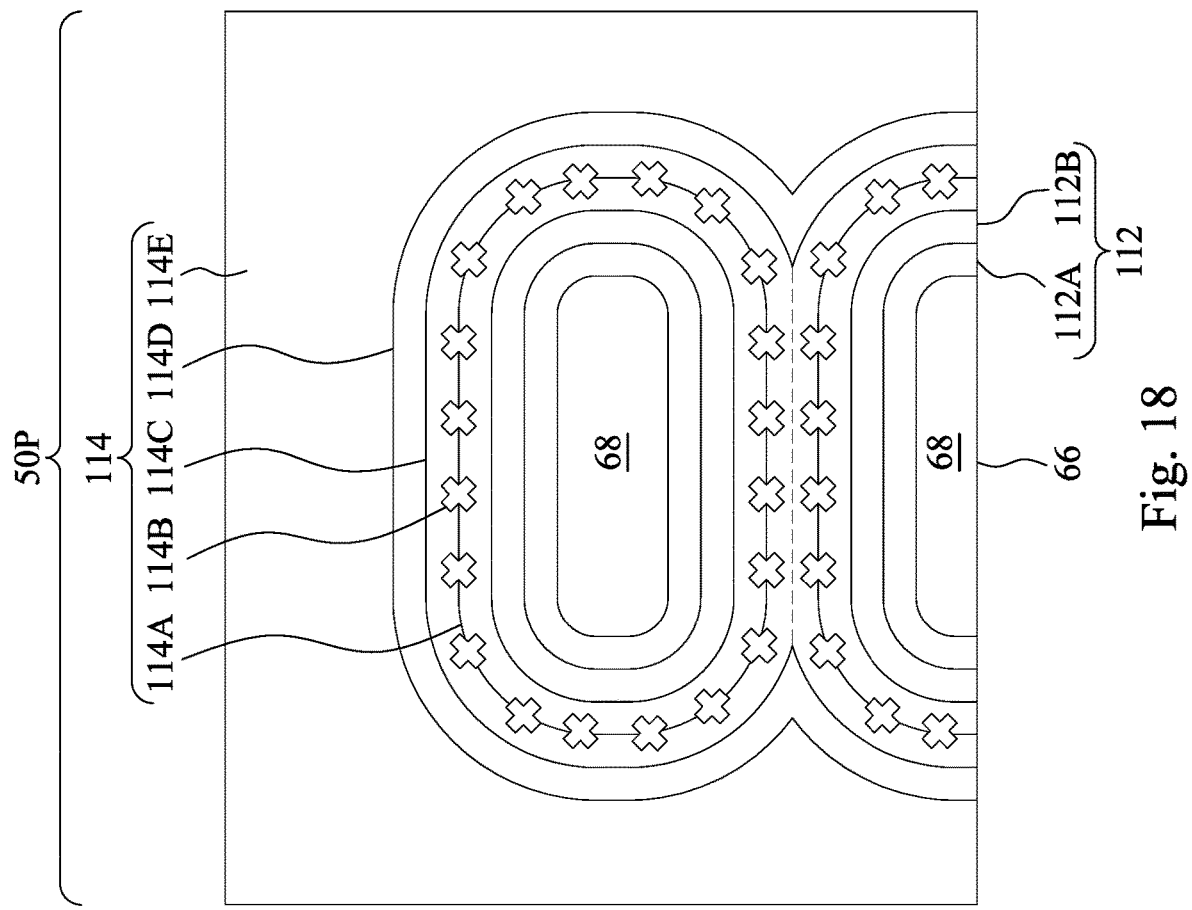

In FIG. 18 and step 214 of the method 200, the remaining portions of the gate electrode layers 114 are deposited to fill the remaining portions of the recesses 110 in the p-type region 50P. Specifically, a fill layer 114E is deposited on the second conductive material 114C. Optionally, an adhesion layer 114D is formed between the fill layer 114E and the second conductive material 114C. After formation is complete, the gate electrode layers 114 in the p-type region 50P include the first conductive material 114A, the residue 114B (if present), the second conductive material 114C, the adhesion layer 114D, and the fill layer 114E.

The adhesion layer 114D may be deposited conformally over the second conductive material 114C. The adhesion layer 114D may be formed of a conductive material such as titanium nitride, tantalum nitride, or the like, which may be deposited by CVD, ALD, PECVD, PVD, or the like. The adhesion layer 114D may alternately be referred to as a glue layer and improves adhesion between the second conductive material 114C and the fill layer 114E.

The fill layer 114E is deposited over the adhesion layer 114D. In some embodiments, the fill layer 114E may be formed of a conductive material such as cobalt, ruthenium, aluminum, tungsten, combinations thereof, or the like, which may be deposited by CVD, ALD, PECVD, PVD, or the like. The fill layer 114E fills the remaining portions of the recesses 110 in the p-type region 50P.

In the p-type region 50P, the gate dielectric layers 112 (e.g., the first gate dielectric layer 112A and the second gate dielectric layer 112B) and the gate electrode layers 114 (e.g., the first conductive material 114A, the residue 114B (if present), the second conductive material 114C, the adhesion layer 114D, and the fill layer 114E) may each be formed on top surfaces, sidewalls, and bottom surfaces of the second nanostructures 66. The residue 114B may be formed at an interface between the first conductive material 114A and the second conductive material 114C, and a metal element of the residue 114B may be different than a metal element of the first conductive material 114A and/or a metal element of the second conductive material 114C.

Figure 19:
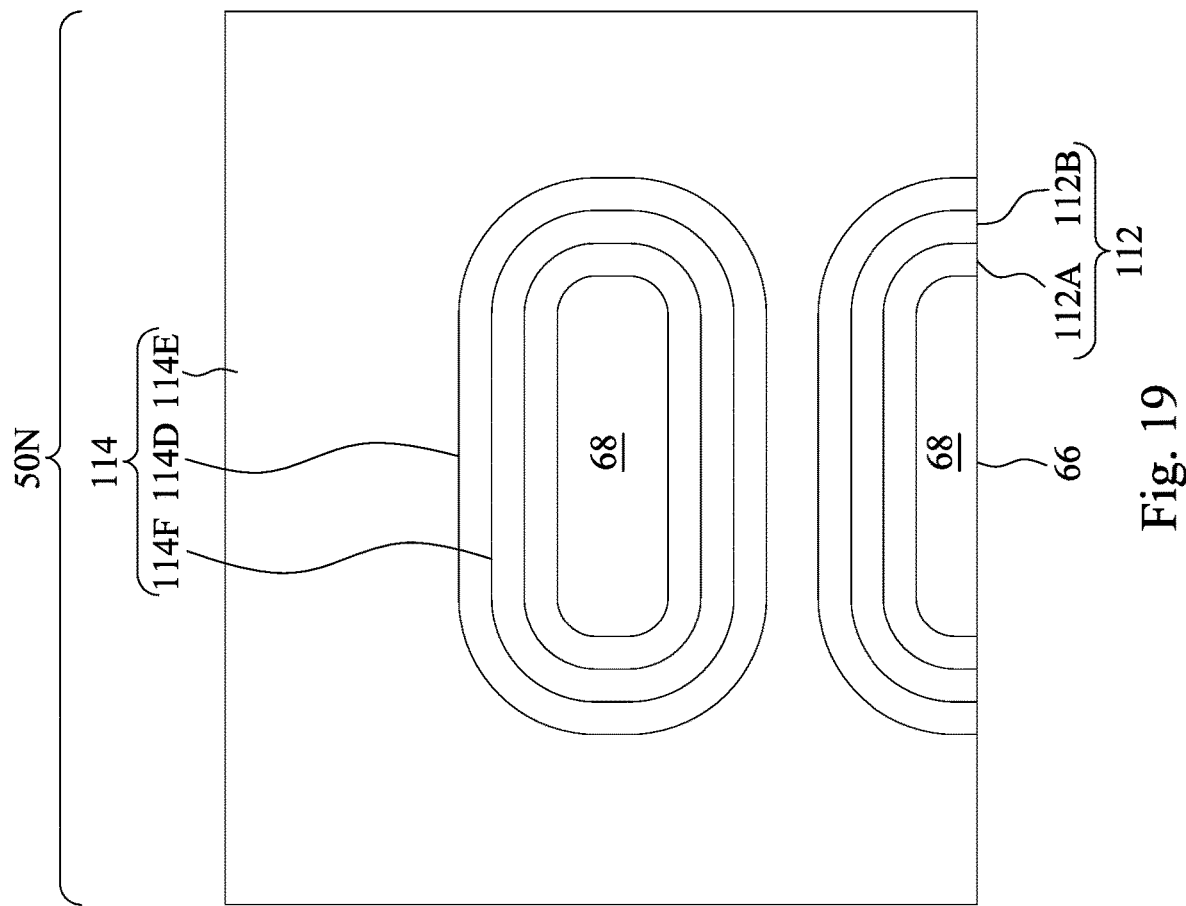

FIG. 19 illustrates gate dielectric layers 112 and gate electrode layers 114 for replacement gates, which are formed in the recesses 110 in the n-type region 50N. Features in regions that are similar to a region 50R in FIG. 13A are illustrated. In some embodiments, the gate dielectric layers 112 in the n-type region 50N and the p-type region 50P may be formed simultaneously. Further, at least portions of the gate electrode layers 114 in the n-type region 50N may be formed either before or after forming the gate electrode layers 114 in the p-type region 50P (see FIGS. 14 through 18), and at least portions of the gate electrode layers 114 in the n-type region 50N may be formed while the p-type region 50P is masked. As such, the gate electrode layers 114 in the n-type region 50N may include different materials than the gate electrode layers 114 in the p-type region 50P. For example, the gate electrode layers 114 in the n-type region 50N may include a layer of a third conductive material 114F. The third conductive material 114F is a n-type work function metal (NWFM) such as, titanium aluminum, titanium aluminum carbide, tantalum aluminum, tantalum carbide, combinations thereof, or the like, which may be deposited by CVD, ALD, PECVD, PVD, or the like. Thus, the layer of the third conductive material 114F may be referred to as a work function tuning layer. Because the third conductive material 114F is deposited after the aluminum treatment 118 and the fluorine treatment 120, the third conductive material 114F may be free of fluorine and aluminum, or at least may have a lower concentration of fluorine and aluminum than the first conductive material 114A. The gate electrode layers 114 in the n-type region 50N may also include an adhesion layer 114D and a fill layer 114E. The adhesion layer 114D in the n-type region 50N may (or may not) have a same material composition and be deposited concurrently with the adhesion layer 114D in the p-type region 50P. The fill layer 114E in the n-type region 50N may (or may not) have a same material composition and be deposited concurrently with the fill layer 114E in the p-type region 50P.

In some embodiments, the third conductive material 114F is different from the first conductive material 114A and the second conductive material 114C. For example, the first conductive material 114A and the second conductive material 114C may each be titanium nitride or tantalum nitride, while the third conductive material 114F is aluminum nitride.

Figure 20B:
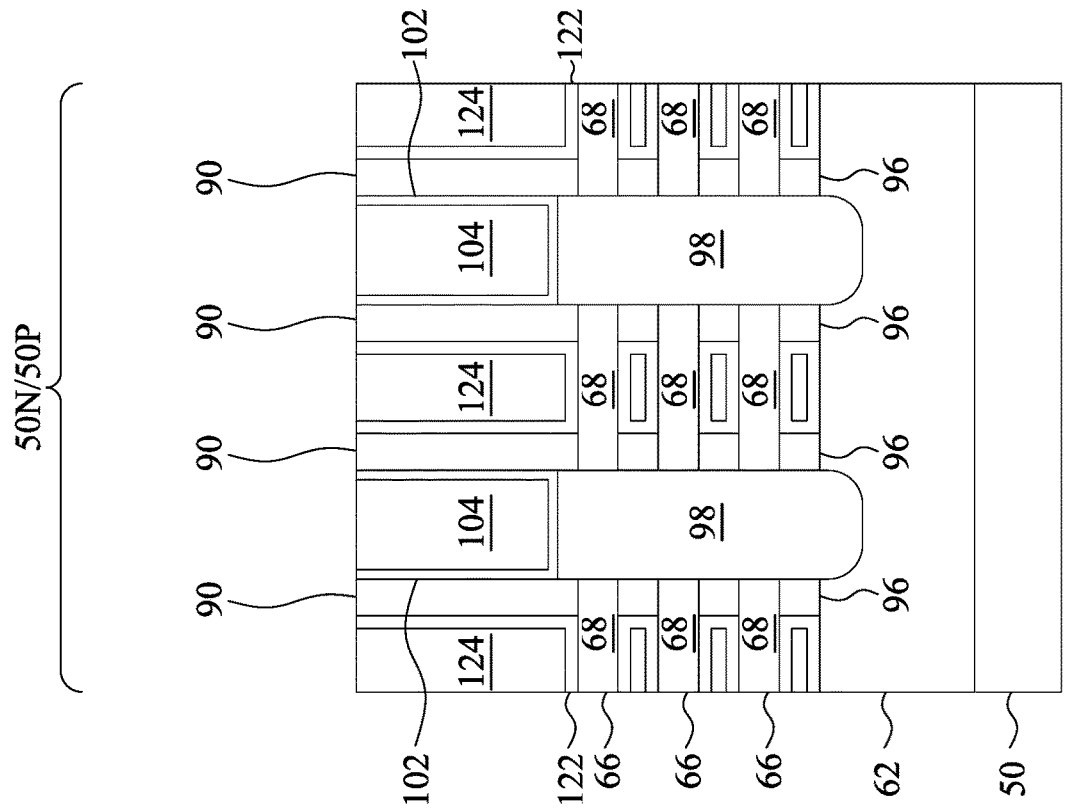
Figure 20A:
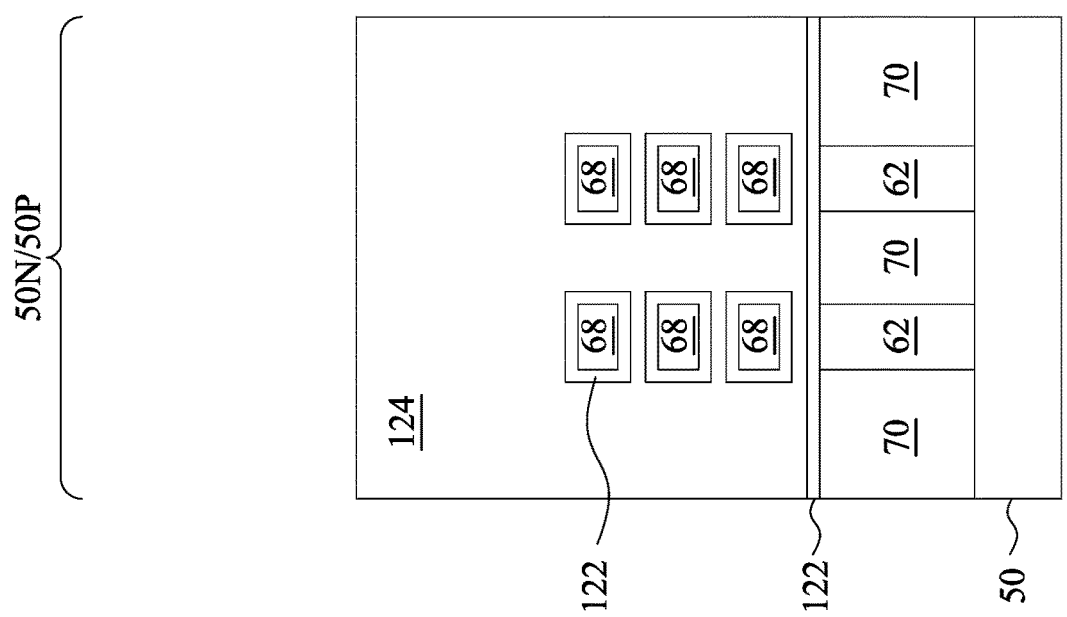

In FIGS. 20A and 20B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 110 (thus forming the gate dielectrics 122). The gate electrode layer 114, when planarized, has portions left in the recesses 110 (thus forming the gate electrodes 124). The top surfaces of the gate spacers 90; the CESL 102; the first ILD 104; the gate dielectrics 122 (e.g., the first gate dielectric layers 112A and the second gate dielectric layers 112B, see FIG. 18); and the gate electrodes 124 (e.g., the first conductive material 114A, the second conductive material 114C, the adhesion layer 114D, the fill layer 114E, and the third conductive material 114F, see FIGS. 18 and 19) are coplanar (within process variations). The gate dielectrics 122 and the gate electrodes 124 form replacement gates of the resulting nano-FETs. Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

Figure 21B:
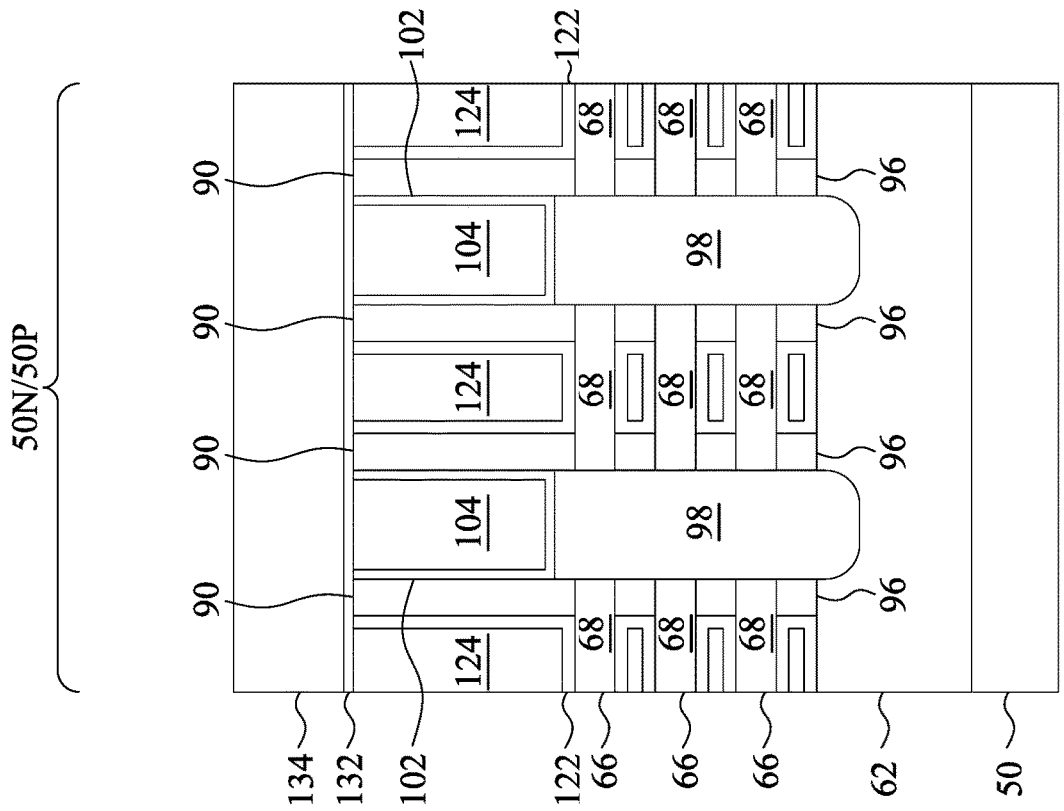
Figure 21A:
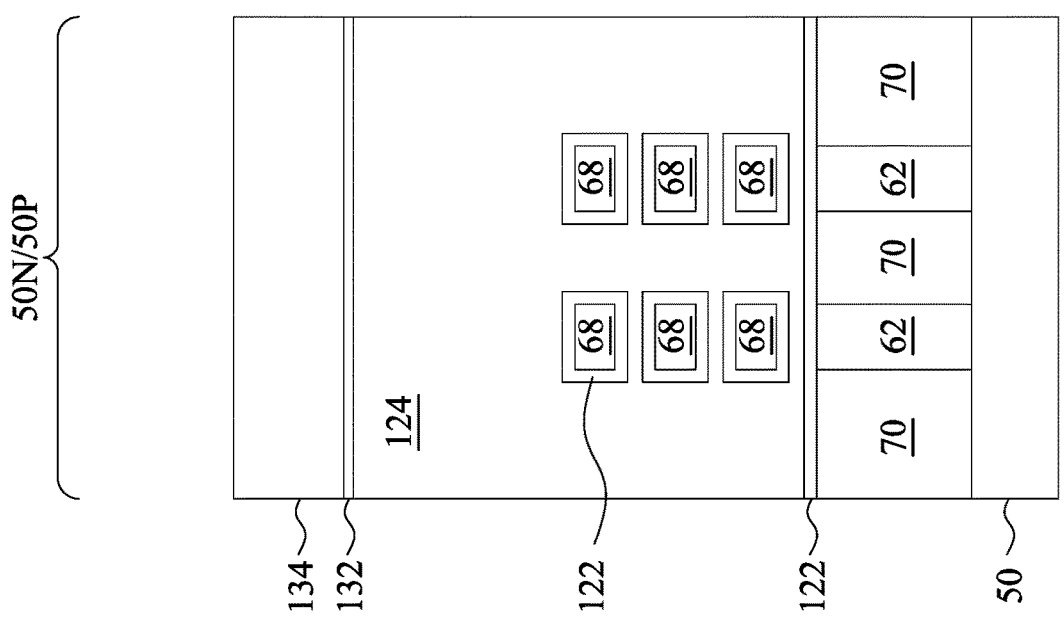

In FIGS. 21A and 21B, a second ILD 134 is deposited over the gate spacers 90, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, and may be deposited by any suitable method, such as CVD and PECVD.

In some embodiments, an etch stop layer (ESL) 132 is formed between the second ILD 134 and the gate spacers 90, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

Figure 22B:
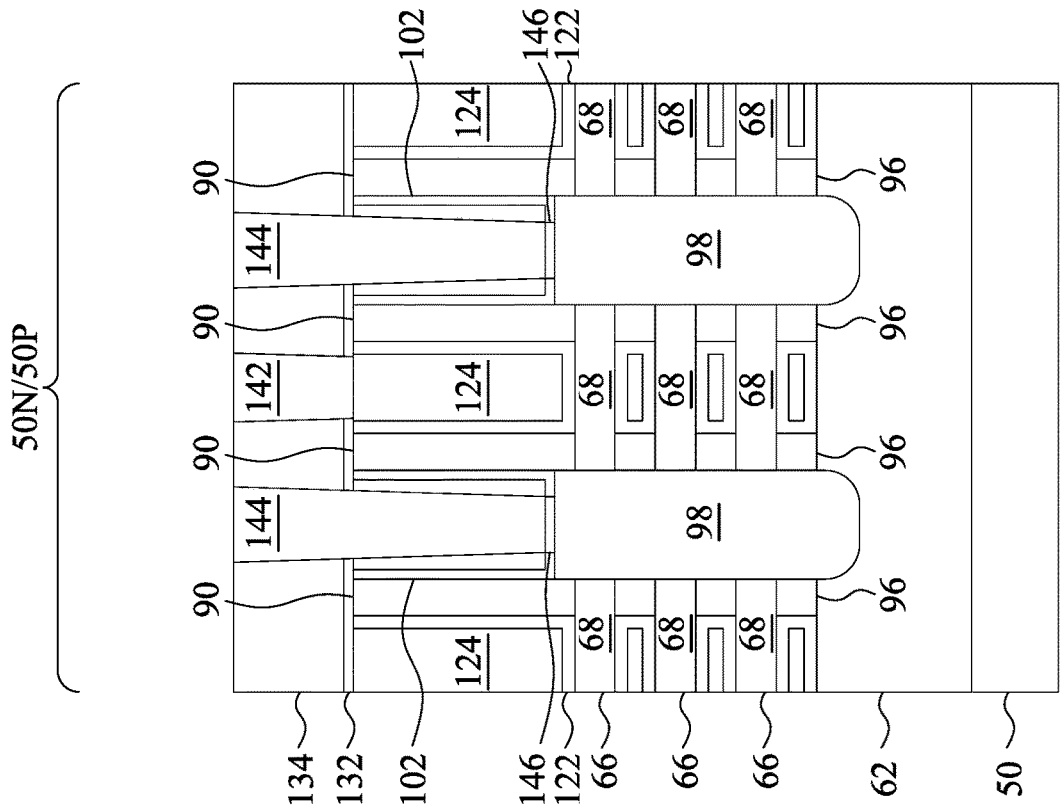
Figure 22A:
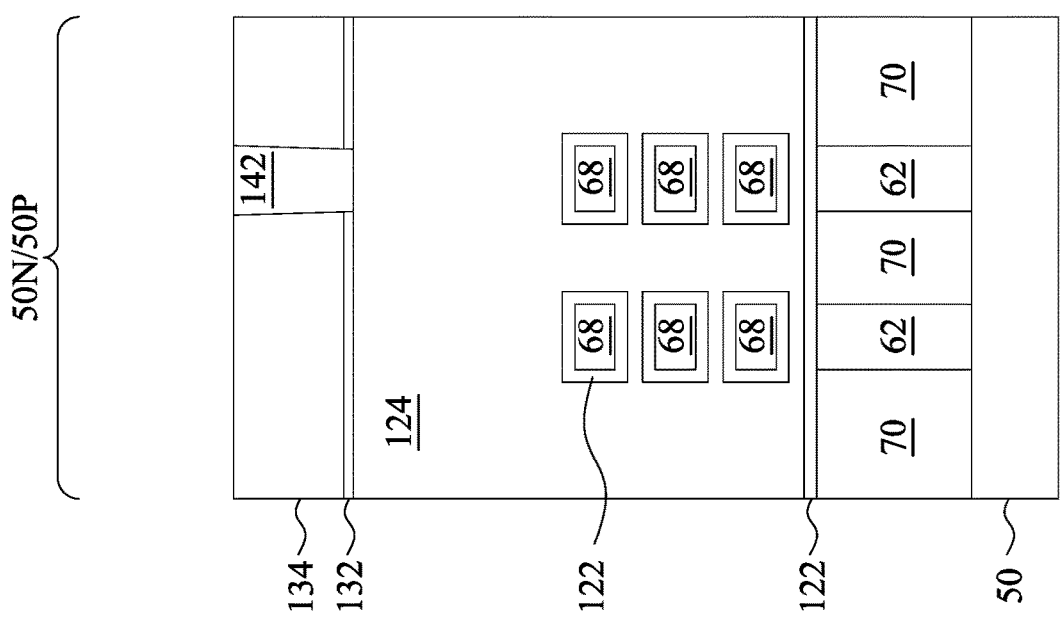

In FIGS. 22A and 22B, gate contacts 142 and source/drain contacts 144 are formed to contact, respectively, the gate electrodes 124 and the epitaxial source/drain regions 98. The gate contacts 142 are physically and electrically coupled to the gate electrodes 124, and the source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interface between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

FIG. 24 is a view of nano-FETs, in accordance with some other embodiments. This embodiment is similar to that described for FIG. 18, except the residue 114B is not formed between the first conductive material 114A and the second conductive material 114C. This may be achieved, for example, when all of the aluminum of the aluminum-containing precursor used during the aluminum treatment 118 bonds to fluorine during the fluorine treatment 120 (see FIG. 16) and/or when the fluorine-containing precursor used during the fluorine treatment 120 does not contain a metal. For example, in embodiments where the fluorine-containing precursor is $NF_3$ and all aluminum bonds to fluorine, the residue 114B may not be formed.

Figures 25A, 25B:
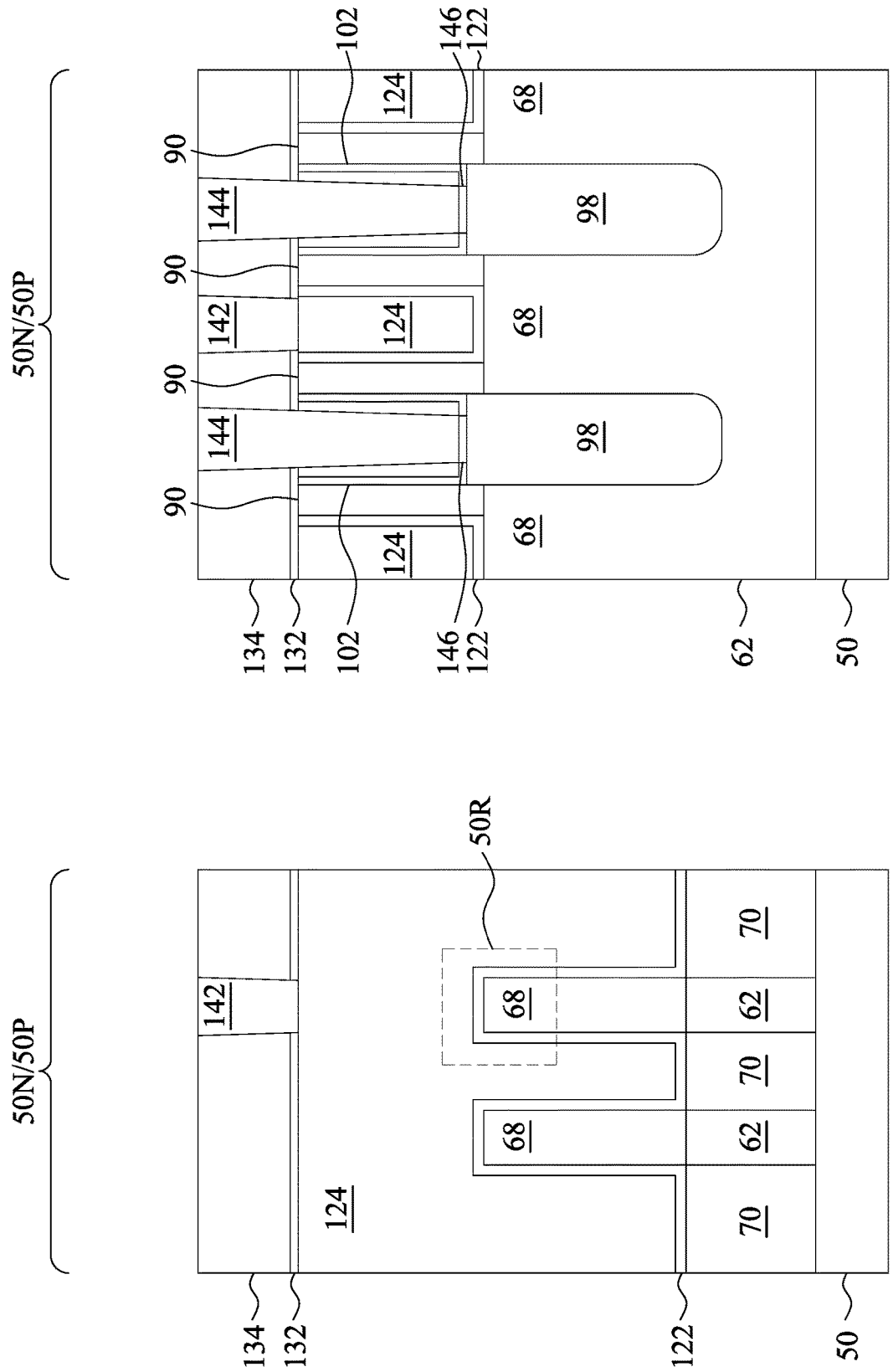
Figure 26:
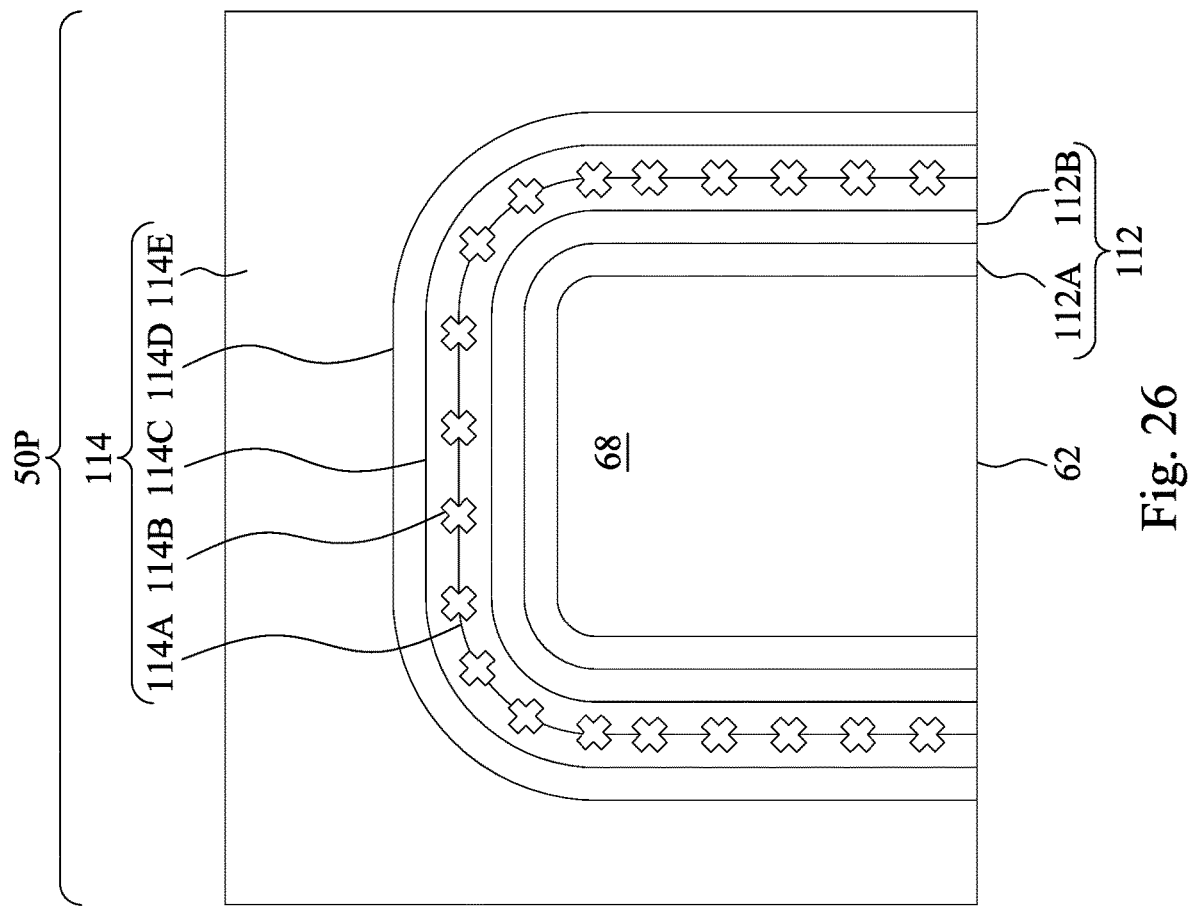

As noted above, some embodiments contemplate aspects used in planar devices, such as planar FETs or in fin field-effect transistors (FinFETs). FIGS. 25A through 26 are views of FinFETs, in accordance with some embodiments. FIGS. 25A and 25B show a similar view as FIGS. 22A and 22B, and FIG. 26 shows a similar view as FIG. 18, except for FinFETs instead of nano-FETs. In the illustrated embodiment, the fins 62 include the channel regions 68, and the gate structures extend along the sidewalls and the top surfaces of the fins 62. FIG. 26 shows an embodiment where the gate structures include residue 114B, but the residue 114B may be omitted in a similar manner as previously described for FIG. 24.

Figure 27:
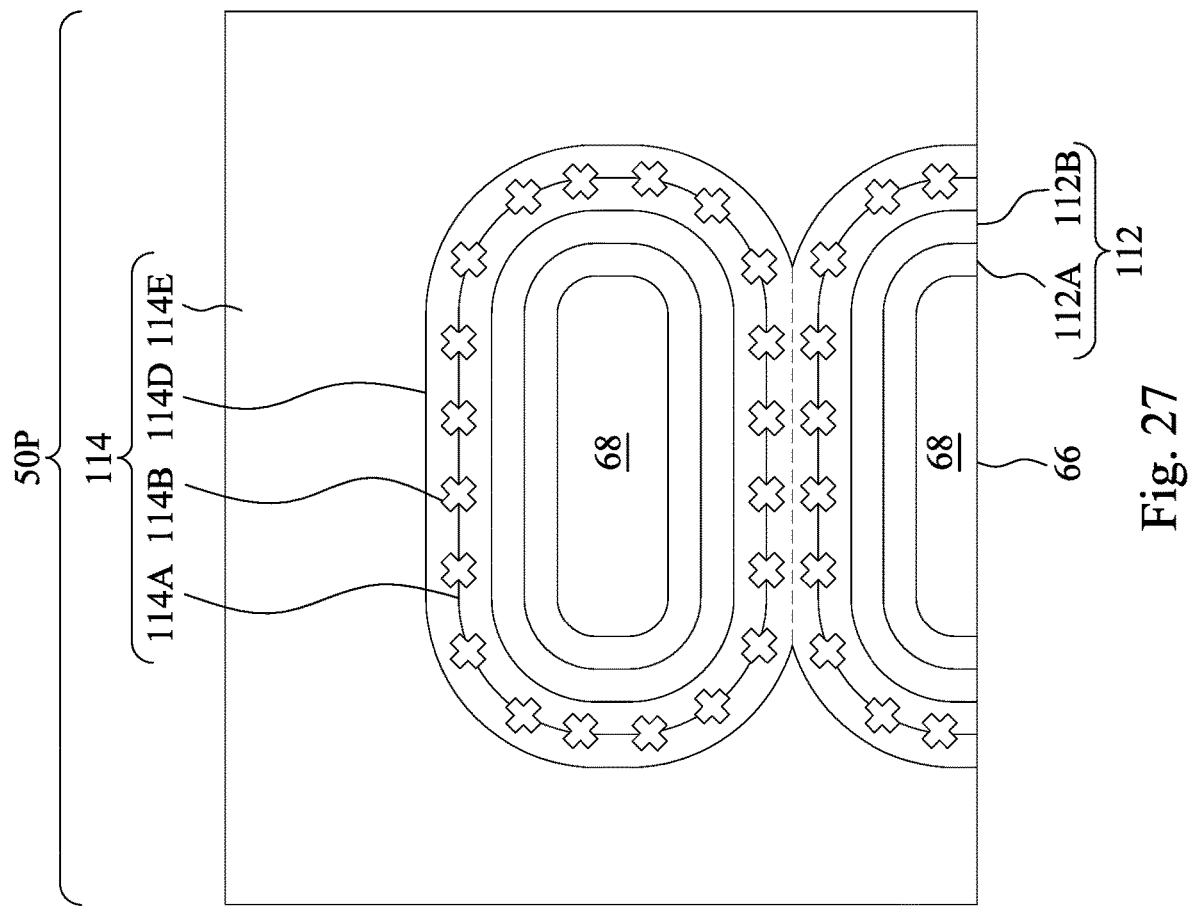
FIGS. 27 and 28 are views of devices, in accordance with some embodiments.
Figure 28:
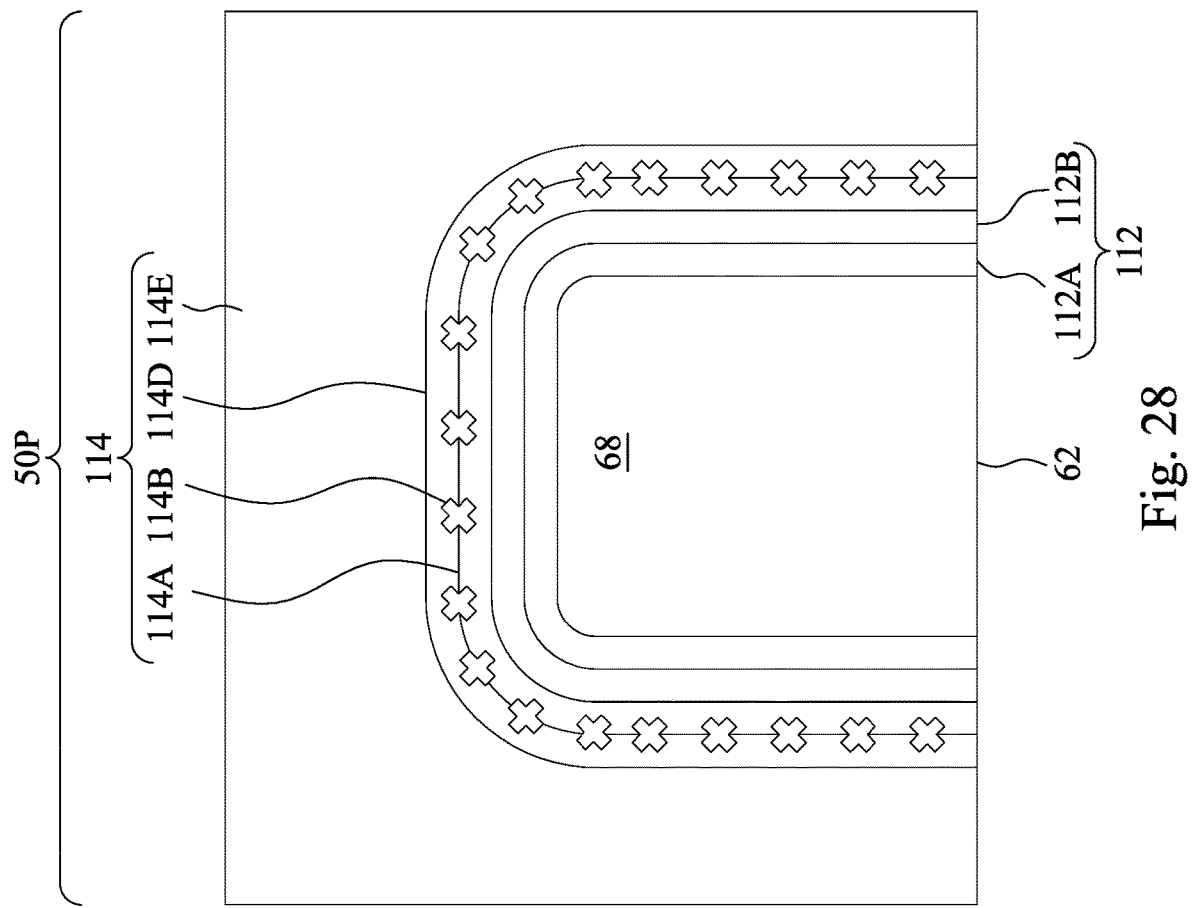

Some embodiments contemplate the omission of certain work function tuning layers. FIGS. 27 and 28 are views of devices, in accordance with some embodiments. FIG. 27 shows nano-FETs, in a similar view as FIG. 18, and FIG. 28 shows FinFETs, in a similar view as FIG. 26. In these embodiments, the first conductive material 114A is treated, but the second conductive material 114C is omitted. Manufacturing complexity may be reduced by the elimination of the second conductive material 114C.

Figure 29:
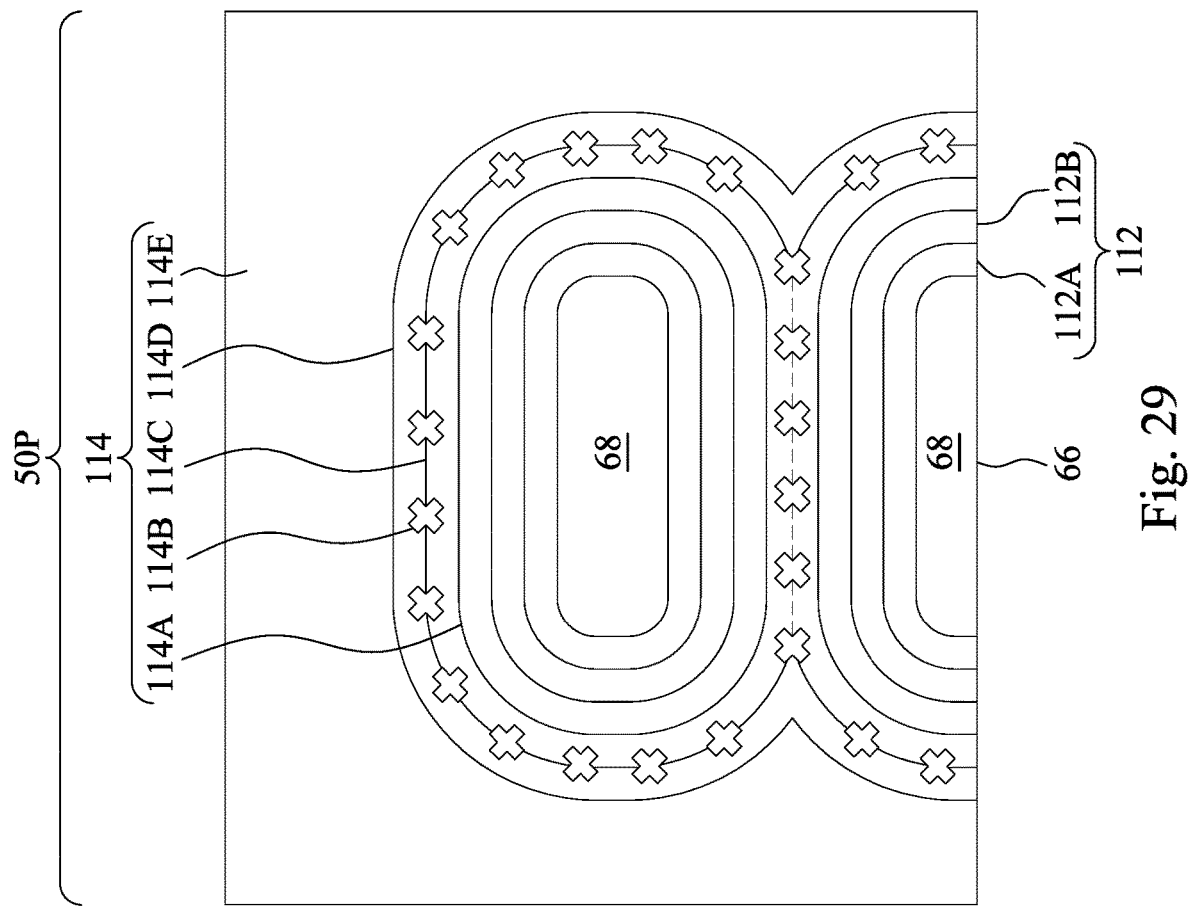
FIGS. 29 and 30 are views of devices, in accordance with some embodiments.
Figure 30:
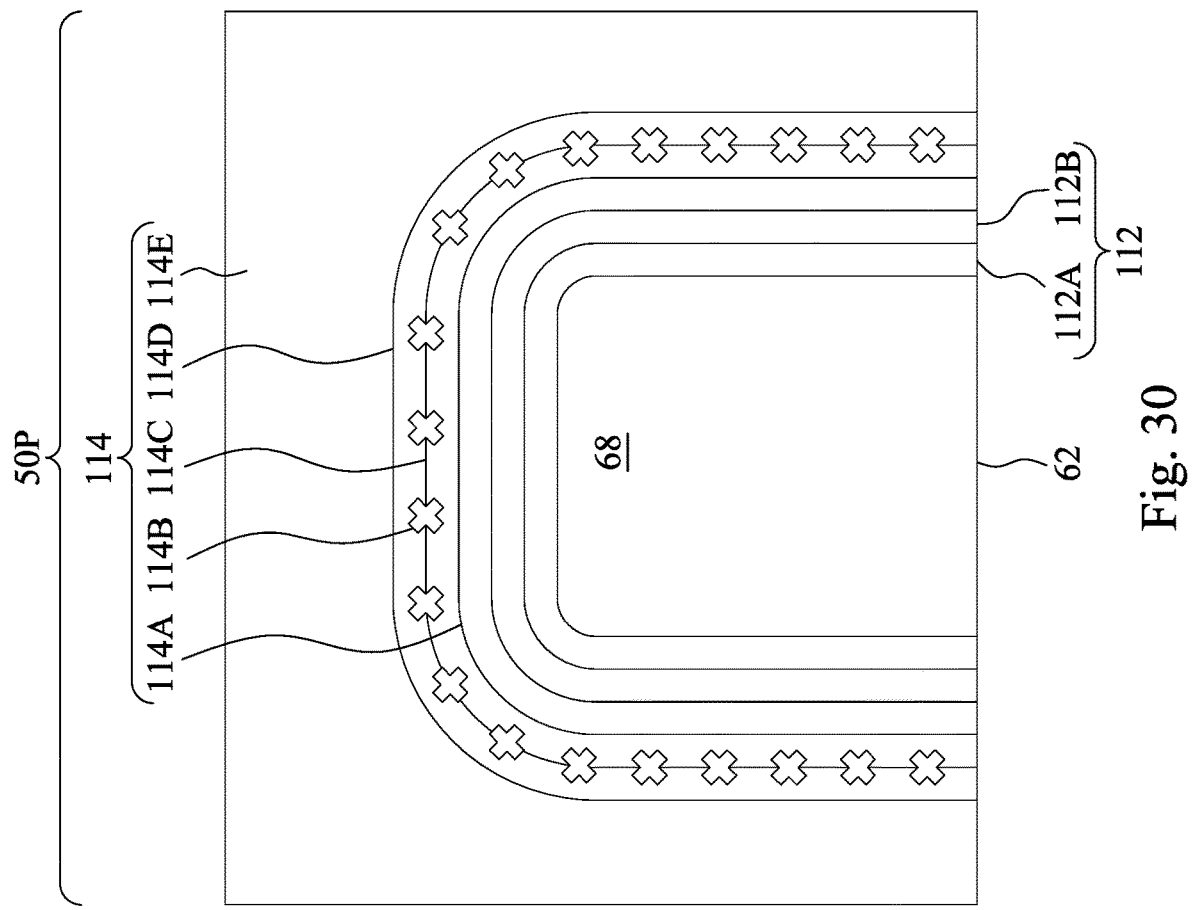

Some embodiments contemplate the fluorine treatment of other work function tuning layers. FIGS. 29 and 30 are views of devices, in accordance with some embodiments. FIG. 29 shows nano-FETs, in a similar view as FIG. 18, and FIG. 30 shows FinFETs, in a similar view as FIG. 26. In these embodiments, the first conductive material 114A and the second conductive material 114C are both included, but the second conductive material 114C is treated instead of the first conductive material 114A. Thus, the residue 114B may be formed on the second conductive material 114C instead of on the first conductive material 114A. Treating the second conductive material 114C instead of the first conductive material 114A may allow for the formation of devices with other desired threshold voltages.

Embodiments may achieve advantages. Performing the fluorine treatment 120 forms a gate stack having a fluorine-treated WFM layer. For example, the fluorine treatment may include performing a fluorine soak on a WFM layer, which may also diffuse fluorine into an underlying gate dielectric (e.g., a high-k gate dielectric). Performing the aluminum treatment 118 increases the effectiveness of the fluorine treatment 120 so that more fluorine is incorporated into the WFM layer. As a result, a flatband voltage of the resulting transistor can be increased towards a band edge of the metal of the WFM layer, a threshold voltage of the resulting transistor can be decreased, and device performance may be improved.

In an embodiment, a device includes: a first channel region; a second channel region; and a gate structure around the first channel region and the second channel region, the gate structure including: a gate dielectric layer; a first p-type work function metal on the gate dielectric layer, the first p-type work function metal including fluorine and aluminum; a second p-type work function metal on the first p-type work function metal, the second p-type work function metal having a lower concentration of fluorine and a lower concentration of aluminum than the first p-type work function metal; and a fill layer on the second p-type work function metal. In some embodiments of the device, a first region of the gate structure is disposed between the first channel region and the second channel region, and a ratio of fluorine to aluminum in the first region of the gate structure is in a range of 0.005 to 0.1. In some embodiments of the device, the gate structure further includes: metal residue at an interface between the first p-type work function metal and the second p-type work function metal, the metal residue including aluminum and tungsten. In some embodiments of the device, a first region of the gate structure is disposed between the first channel region and the second channel region, and a ratio of fluorine to tungsten in the first region of the gate structure is in a range of 0.005 to 0.1. In some embodiments of the device, the gate dielectric layer includes fluorine and hafnium. In some embodiments of the device, a first region of the gate structure is disposed between the first channel region and the second channel region, and a ratio of fluorine to hafnium in the first region of the gate structure is in a range of 0.015 to 0.2.

In an embodiment, a device includes: a channel region; an interfacial layer on the channel region; a high-k gate dielectric layer on the interfacial layer; a first work function tuning layer on the high-k gate dielectric layer, the first work function tuning layer including a first p-type work function metal, aluminum in the first p-type work function metal, and fluorine in the first p-type work function metal; a second work function tuning layer on the first work function tuning layer, the second work function tuning layer including a second p-type work function metal, the second work function tuning layer free from fluorine and aluminum; an adhesion layer on the second work function tuning layer; and a fill layer on the adhesion layer. In some embodiments of the device, the high-k gate dielectric layer includes fluorine and hafnium, the high-k gate dielectric layer is free from aluminum. In some embodiments of the device, the first work function tuning layer and the second work function tuning layer are titanium nitride. In some embodiments of the device, the first work function tuning layer is titanium nitride and the second work function tuning layer is tantalum nitride.

In an embodiment, a method includes: depositing a gate dielectric layer on a channel region; depositing a first p-type work function metal on the gate dielectric layer; performing an aluminum treatment on the first p-type work function metal; after performing the aluminum treatment, performing a fluorine treatment on the first p-type work function metal; and after performing the fluorine treatment, depositing a second p-type work function metal on the first p-type work function metal. In some embodiments of the method, the aluminum treatment incorporates aluminum into the first p-type work function metal, the fluorine treatment incorporates fluorine into the first p-type work function metal, and the fluorine incorporated during the fluorine treatment bonds to the aluminum incorporated during the aluminum treatment. In some embodiments of the method, the aluminum treatment is a first deposition process that exposes a surface of the first p-type work function metal to an aluminum-containing precursor, and the fluorine treatment is a second deposition process that exposes the surface of the first p-type work function metal to a fluorine-containing precursor. In some embodiments of the method, the fluorine-containing precursor is $WF_x$, $NF_x$, $TiF_x$, $TaF_x$, or $HfF_x$, and x is an integer in a range of 1 to 6. In some embodiments of the method, the aluminum-containing precursor is triethylaluminium or trimethylaluminium. In some embodiments of the method, the first deposition process and the second deposition process are performed in a same deposition chamber. In some embodiments of the method, the first deposition process and the second deposition process are performed at a same temperature. In some embodiments of the method, the first deposition process and the second deposition process are performed at different temperatures. In some embodiments of the method, no aluminum diffuses into the gate dielectric layer during the aluminum treatment. In some embodiments of the method, fluorine diffuses into the gate dielectric layer during the fluorine treatment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a first transistor comprising:
  a first channel region;
  a first gate dielectric on the first channel region; and
  a first gate electrode on the first gate dielectric, the first gate electrode comprising a first p-type work function tuning layer, the first p-type work function tuning layer comprising fluorine and aluminum; and
 a second transistor comprising:
  a second channel region;
  a second gate dielectric on the second channel region; and
  a second gate electrode on the second gate dielectric, the second gate electrode comprising a n-type work function tuning layer, the n-type work function tuning layer having a lower concentration of fluorine and a lower concentration of aluminum than the first p-type work function tuning layer.

2. The device of claim 1, wherein the first gate electrode further comprises:
 a second p-type work function tuning layer on the first p-type work function tuning layer.

3. The device of claim 2, wherein the second p-type work function tuning layer comprises fluorine and aluminum.

4. The device of claim 2, wherein the second p-type work function tuning layer is free of fluorine and aluminum.

5. The device of claim 2, wherein the first gate electrode further comprises:
aluminum residue on the second p-type work function tuning layer.

6. The device of claim 1, wherein the first gate electrode further comprises:
aluminum residue on the first p-type work function tuning layer.

7. The device of claim 1, wherein the first gate dielectric comprises fluorine.

8. A method comprising:
depositing a gate dielectric layer over a channel region;
depositing a first p-type work function metal over the gate dielectric layer;
performing an aluminum treatment on the first p-type work function metal, the aluminum treatment incorporating aluminum into the first p-type work function metal;
after performing the aluminum treatment, performing a fluorine treatment on the first p-type work function metal, the fluorine treatment incorporating fluorine into the first p-type work function metal, the fluorine bonding to the aluminum in the first p-type work function metal; and
after performing the fluorine treatment, depositing a fill layer over the first p-type work function metal.

9. The method of claim 8, further comprising:
after performing the fluorine treatment, depositing a second p-type work function metal over the first p-type work function metal, the fill layer deposited over the second p-type work function metal.

10. The method of claim 8, wherein the aluminum treatment comprises:
flowing an aluminum-containing precursor over surfaces of the first p-type work function metal in a chamber.

11. The method of claim 10, wherein the fluorine treatment comprises:
flowing a fluorine-containing precursor over the surfaces of the first p-type work function metal in the chamber without breaking a vacuum in the chamber between the aluminum treatment and the fluorine treatment.

12. The method of claim 10, wherein the aluminum-containing precursor is an organoaluminium, the aluminum treatment is performed at a temperature in a range of 250° C. to 475° C., and the aluminum treatment is performed for a duration in a range of 1 second to 15 minutes.

13. The method of claim 12, wherein the organoaluminium is triethylaluminium or trimethylaluminium.

14. The method of claim 8, wherein no aluminum diffuses into the gate dielectric layer during the aluminum treatment.

15. The method of claim 8, wherein aluminum also diffuses into the gate dielectric layer during the aluminum treatment.

16. A method comprising:
depositing a gate dielectric layer over a channel region;
depositing a p-type work function metal over the gate dielectric layer;
after depositing the p-type work function metal, creating bonding sites in the p-type work function metal by flowing an aluminum-containing precursor over surfaces of the p-type work function metal;
bonding fluorine to the bonding sites in the p-type work function metal by flowing a fluorine-containing precursor over the surfaces of the p-type work function metal; and
depositing a fill layer over the p-type work function metal.

17. The method of claim 16, wherein the flowing the aluminum-containing precursor and the flowing the fluorine-containing precursor are performed in a same deposition chamber without breaking a vacuum in the same deposition chamber.

18. The method of claim 16, wherein the flowing the aluminum-containing precursor and the flowing the fluorine-containing precursor are performed at a same temperature.

19. The method of claim 16, wherein the flowing the aluminum-containing precursor and the flowing the fluorine-containing precursor are performed at different temperatures.

20. The method of claim 16, wherein the aluminum-containing precursor is triethylaluminium or trimethylaluminium, and the fluorine-containing precursor is $WF_x$, $NF_x$, $TiF_x$, $TaF_x$, or $HfF_x$.

* * * * *